US006579739B2

(12) United States Patent
Terada et al.

(10) Patent No.: US 6,579,739 B2
(45) Date of Patent: Jun. 17, 2003

(54) OPTICAL TRANSMITTING AND RECEIVING DEVICE AND THE MANUFACTURING METHOD

(75) Inventors: Koji Terada, Kanagawa (JP); Haruhiko Tabuchi, Kanagawa (JP); Kazuhiro Tanaka, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/987,897

(22) Filed: Nov. 16, 2001

(65) Prior Publication Data

US 2002/0027230 A1 Mar. 7, 2002

Related U.S. Application Data

(62) Division of application No. 09/122,093, filed on Jul. 24, 1998.

(30) Foreign Application Priority Data

Jan. 8, 1998 (JP) ............................................. 10-002024

(51) Int. Cl.[7] .................................................. H01L 21/00
(52) U.S. Cl. ............................... 438/48; 438/7; 438/16; 438/48; 438/57; 438/65
(58) Field of Search ............................... 438/48, 57, 7, 438/16, 65

(56) References Cited

U.S. PATENT DOCUMENTS 3,828,283 A   8/1974   Daniel ...................... 333/30 R
4,549,338 A * 10/1985   Abend et al. ................. 438/23

(List continued on next page.)

FOREIGN PATENT DOCUMENTS

EP   0 517 369 A2   9/1992
JP   8-327841        12/1996
JP   9-61664         7/1997

OTHER PUBLICATIONS

Patent Abstracts of Japan for Publication No. 08327841 dated Dec. 13, 1996.
Greg E. Blonder, et al., "Interconnection Processes and Materials", AT&T Technical Journal, (Nov./Dec. 1990).
Y. Nakasuga, et al., "Multi–chip Hybrid Integration on PLC Platform Using Passive Alignment Technique", NTT Opto–electronics Laboratories, 1996 Electronic Components and Technology Conference, Japan.

Primary Examiner—Amir Zarabian
Assistant Examiner—Ida M. Soward
(74) Attorney, Agent, or Firm—Staas & Halsey LLP

(57) ABSTRACT

An insulation film (silicon dioxide film) is laminated on a platform substrate of Si, etc., and a transmitting unit wiring pattern and a receiving unit wiring pattern are provided on the insulation film. Although a base intruded in a convex shape is provided at the bottom of a light emitting device (LED) of the platform substrate, this base is not provided at the bottom of a light receiving device, and the insulation film under the light receiving device becomes thick. A groove is formed in a waveguide, and a WDM filter is mounted. A diamond or SiC layer can also be provided beneath the insulation film to improve the insulation resistance, and a conduction layer is provided beneath the diamond or SiC layer. Electrical crosstalk is suppressed by grounding the conduction layer. Optical crosstalk is improved by locating the LED at the entrance/exit of the WDM filter and the light receiving device on the opposite side.

11 Claims, 29 Drawing Sheets

U.S. PATENT DOCUMENTS

| | | | |
|---|---|---|---|
| 4,619,033 A | | 10/1986 | Jastrzebski .................... 29/571 |
| 4,730,330 A | * | 3/1988 | Plihal et al. ................... 372/50 |
| 4,735,677 A | | 4/1988 | Kawachi et al. |
| 4,816,890 A | * | 3/1989 | Ouchi et al. ................ 257/186 |
| 4,968,114 A | * | 11/1990 | Thillays ....................... 385/39 |
| 4,969,712 A | * | 11/1990 | Westwood et al. ............ 385/14 |
| 5,219,787 A | * | 6/1993 | Carey et al. ................ 438/637 |
| 5,232,749 A | * | 8/1993 | Gilton ........................ 427/558 |
| 5,397,889 A | | 3/1995 | Minot et al. |
| 5,671,315 A | * | 9/1997 | Tabuchi et al. ............. 385/137 |
| 5,696,862 A | * | 12/1997 | Hauer et al. ................... 385/88 |
| 5,715,338 A | * | 2/1998 | Sjolinder et al. ............. 385/14 |
| 5,818,983 A | * | 10/1998 | Yoshimura et al. ........... 385/14 |
| 6,027,254 A | * | 2/2000 | Yamada et al. ............... 385/88 |
| 6,045,652 A | * | 4/2000 | Tuttle et al. ................ 156/292 |
| 6,061,481 A | * | 5/2000 | Heidrich et al. .............. 385/14 |

* cited by examiner

OPTICAL TRANSMITTING AND RECEIVING DEVICE AND THE MANUFACTURING METHOD

This application is a divisional of application Ser. No. 09/122,093, filed Jul. 24, 1998, now allowed.

BACKGROUND OF THE INVENTION

1. Field of the Invention

The present invention relates to an optical transmitting and receiving device incorporating a light emitting device (LED) and a light receiving device into a substrate.

2. Description of the Related Art

Lately, although communication networks using optical fibers are being put into practice, so far only trunk route communication networks have been formed using optical fibers, and channels laid from trunk route networks to subscribers, that is, subscriber channels, still remain as electrical circuits. To further spread the use of optical communication networks, it is desired that all the subscriber channels also consist of optical channels. To meet this expectation a variety of research and development is actively being carried out.

The cost reduction of optical devices including a WDM filter constitutes a very important factor in the construction of an optical subscriber system using a wavelength multiplex technology called an "ATM-PON (Asynchronous Transfer Mode-Passive Optical Network). To reduce the cost, the mounting of a small number of compact optical devices is indispensable, and a device form in which an LED, a light receiving device and a WDM filter are hybrid-mounted on a substrate is expected to be developed. Furthermore, since the transmitting unit and receiving unit of a optical module operate asychronously in the ATM-PON system, it is necessary that the crosstalk between transmission and reception in the module is sufficiently small.

FIG. 1 explains the configuration of a conventional optical transmitting and receiving device.

As shown in FIG. 1, in the conventional optical device an LED 1004, a light receiving device 1005 and a WDM filter 1002 are encapsulated as discrete devices, and the devices are connected to an optical network and with each other using optical fibers 1001 and 1003, respectively. In the optical module with this configuration the CAN packages of the LED 1004 and the light receiving device 1005 are utilized as electrostatic shielding to suppress the crosstalk between transmission and reception signals.

Recently, although a miniature optical transmitting and receiving device hybrid-mounting an LED, a light receiving device and a WDM filter on a waveguide substrate is being developed, the application of this optical device is limited to a TCM (Time-Compression Multiplexing) transmission system for time-dividing transmitting time and receiving time. This is because the crosstalk from the transmitting unit to the receiving unit is difficult to suppress. In the transmitting unit, several tens of milliamperes of current are required to drive the LED, whereas the receiving unit requires only very little current, in the order of a microampere or less. For this reason, the current in the receiving unit is required to be in the order of 10 to 100 nA because of the crosstalk from the transmitting unit.

FIG. 2 explains how crosstalk is generated between an LED and a light receiving device in a hybrid-mounted optical transmitting and receiving device.

To simplify the description, only the minimum necessary component elements are shown in the diagram.

In an optical transmitting and receiving device hybrid-mounting an LED (laser diode: LD) 1100 and a light receiving device (photodiode: PD) 1101, a silicon dioxide film ($SiO_2$) 1104 is formed on a silicon (Si) substrate 1106, and on the silicon dioxide film electrodes 1102 and 1103 are formed. Then, the electrodes 1102 and 1103 are connected to the LD 1100 and PD 1101, respectively. A metallic film (not shown in the diagram) is provided to ground the back of the substrate 1106. Although the silicon dioxide film 1104 is provided so that current may not flow in the electrode 1103 of the PD 1101 due to the voltage generated by the electrode 1102, current leaks to the substrate 1106 by the effect of alternating voltage applied to LD 1100 since the insulation function of the silicon dioxide film 1104 is not complete and the silicon dioxide film 1104 itself has its own capacitance. At this moment, although much of the current flows out of the substrate 1106 since the back of the substrate 1106 is grounded, part of the current reaches the electrode 1103 through the inside of the substrate 1106. Although the current reaching the electrode 1103 is small, significant noise appears on the signal generated by the PD 1101 due to the current reaching the electrode 1103 through the substrate 1106, since there is a significant difference between the current for driving the LD 1100 and the current generated by the PD 1101, as described before. Accordingly, the performance of the PD 1101 in detecting optical signals from the received light beans becomes lower because of this generated current.

In this way, as a result of the conventional configuration, significant crosstalk is generated between the transmitting side and receiving side through the substrate 1106.

The silicon dioxide film 1105 is a heat-oxidized film generated during the substrate processing, and if the back of the substrate 1106 is left unprocessed, the thickness of this silicon dioxide film 1105 will grow to approximately 2 $\mu$m.

To realize a miniature optical device for an ATM-PON, it is necessary to hybrid-mount an LED, a light receiving device and a WDM filter on the same substrate, and to reduce the crosstalk between the transmitting side and the receiving side as described before. The crosstalk between the transmitting side and the receiving side is roughly classified into two groups; crosstalk due to an optical cause such as stray light, etc., and crosstalk due to an electrical cause such as free capacitance, etc.

As described before, the electrical cause is generated by a current flowing between the transmitting side and receiving side through the substrate, and this is a serious problem.

The stray light, etc. is generated by light beams emitted from the LD leaking out from an optical waveguide and generating a mode spreading over all the substrate. Accordingly, when the PD receives such stray light, it becomes impossible to accurately receive optical signals.

SUMMARY OF THE INVENTION

It is an object of the present invention to provide a miniature optical device in which transmission and reception can be simultaneously operated, by reducing the crosstalk between a hybrid-mounted LED and light receiving device.

The optical transmitting and receiving device of the present invention comprises a conduction layer formed on all or a part of the surface of a substrate, an insulation layer formed at least at the bottom of an LED mounting portion and a light receiving device mounting portion, an optical waveguide formed on the surface of the insulation layer, electric wiring patterns formed on the surface of the insulation layer, and an LED and a light receiving device connected to the electric wiring patterns so as to be optically coupled with the optical waveguide. The optical transmitting and receiving device is characterized in that the above-mentioned conduction layer is made electrically connectable to a constant potential portion.

The manufacturing method of the optical transmitting and receiving device of the present invention comprises the steps of forming a conduction layer by doping an impurity on the surface of the substrate, laminating an insulation layer on the surface of the conduction layer, providing an optical waveguide on the insulation layer and mounting an LED and a light receiving device.

The optical transmitting and receiving device in another aspect of the present invention is characterized in that in an optical transmitting and receiving device hybrid-mounting at least an LED and a light receiving device on the same substrate through the insulation layer, a conduction layer is located at least at the bottom of the above-mentioned LED and the above-mentioned light receiving device, and between the above-mentioned substrate and the above-mentioned insulation layer, and the conduction layer can be electrically connected to a constant potential portion.

The optical transmitting and receiving device in another aspect of the present invention is characterized in that in an optical transmitting and receiving device hybrid-mounting at least an LED and a light receiving device on the same substrate through the insulation layer, the above-mentioned substrate is a semiconductor substrate of one (p or n type) conduction type, and a semiconductor layer of one (n or p type) conduction type the reverse of the above-mentioned (p or n type) conduction type, forming a pn junction together with the above-mentioned semiconductor substrate, and is located at least at the bottom of the above-mentioned LED and the above-mentioned light receiving device and between the above-mentioned semiconductor substrate and the above-mentioned insulation layer, and the voltage applied between the above-mentioned LED and a light receiving device, and the back of the above-mentioned semiconductor substrate is biased the reverse of the above-mentioned pn junction.

The manufacturing method of the optical transmitting and receiving device in another aspect of the present invention is characterized in that in the manufacturing method of an optical transmitting and receiving device hybrid-mounting at least an LED and a light receiving device on the same substrate through the insulation layer, comprises a process for forming a conduction layer electrically connectable to the constant potential portion on the surface layer portion of the above-mentioned substrate and at the bottom of at least the above-mentioned LED mounting portion and the above-mentioned light receiving device mounting portion, prior to the formation of the above-mentioned insulation layer.

The manufacturing method of the optical transmitting and receiving device in another aspect of the present invention is characterized in that in the manufacturing method of an optical transmitting and receiving device hybrid-mounting at least an LED and a light receiving device on the same substrate through the insulation layer, comprises a process for forming a conduction layer of one (n or p type) conduction type the reverse of the above-mentioned (p or n type) conduction type, forming a pn junction together with the above-mentioned semiconductor substrate, on the surface layer portion of the above-mentioned substrate and at the bottom of a portion mounting at least the above-mentioned LED and the above-mentioned light receiving device, prior to the formation of the above-mentioned insulation layer using a semiconductor substrate of one (p or n type) conduction type for the above-mentioned substrate.

The platform of the optical transmitting and receiving device of the present invention comprises a conduction layer formed on all or a part of the surface of the substrate, an insulation layer formed at the bottom of portions mounting at least an LED and a light receiving device, an optical waveguide formed on the surface of the insulation layer, and an electric wiring pattern formed on the surface of the insulation layer, and is characterized in that the above-mentioned conduction layer can be electrically connected to a constant potential portion.

The manufacturing method of the platform of the optical transmitting and receiving device of the present invention comprises the steps of forming a conduction layer by doping an impurity on the surf ace of the substrate, laminating an insulation layer on the surf ace of the conduction layer, providing an optical waveguide on the surf ace of the insulation layer, and forming an electric wiring pattern on the surface of the insulation layer.

According to such an optical transmitting and receiving device of the present invention, since the current leaking from the LED to the substrate through the conduction layer can be eliminated, no current leaks to the light receiving device side. Accordingly, the crosstalk between the transmitting side and the receiving side can be suppressed, the transmission side and the receiving side can be simultaneously operated, and thereby a miniature hybrid-mounted optical transmitting and receiving device required to construct a subscriber system in an optical communication network using an optical circuit can be provided.

DESCRIPTION OF THE PREFERRED EMBODIMENTS

Figure 1:
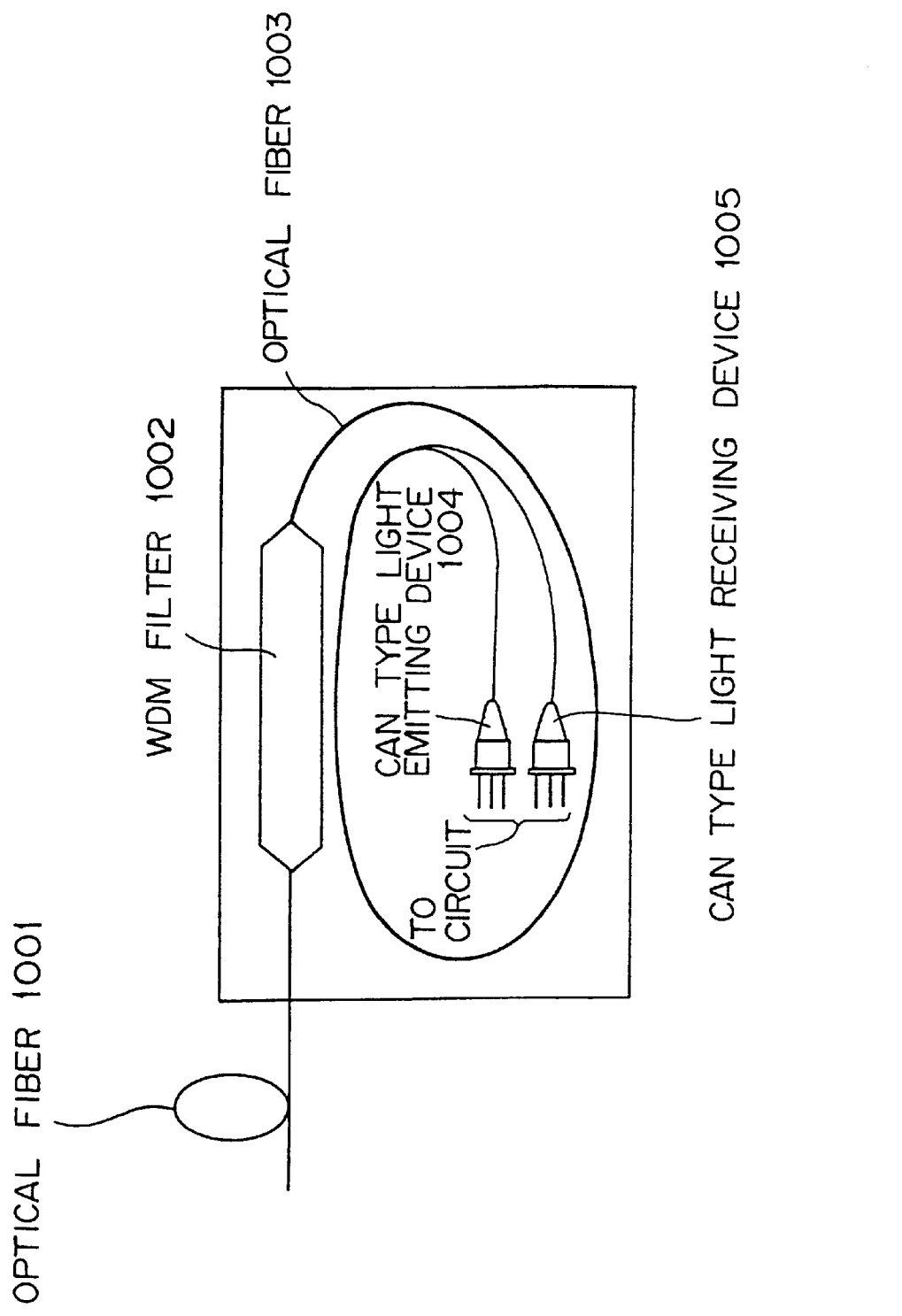
FIG. 1 Explains the configuration of a conventional optical transmitting and receiving device.
Figure 2:
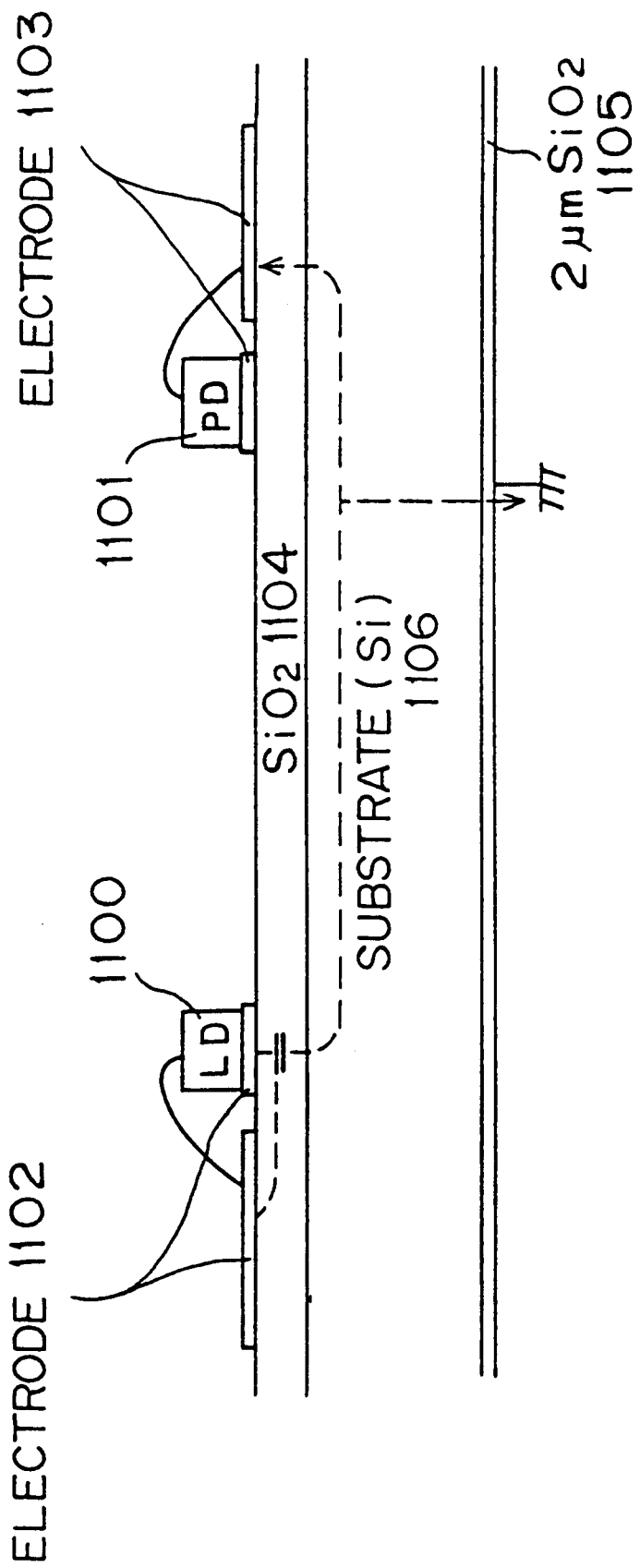
FIG. 2 explains the phenomenon that crosstalk is generated between an LED and a light receiving device in a hybrid-mounted optical transmitting and receiving device.
Figure 3A:
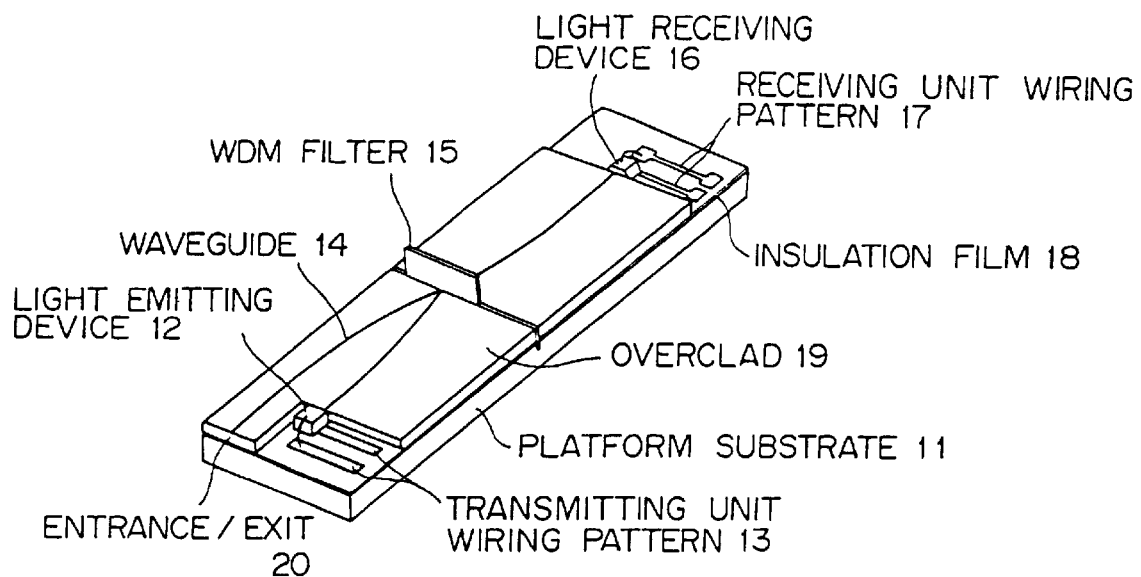
FIGS. 3A and 3B show an example of a hybrid-mounted optical device using a PLC platform according to the present invention.
Figure 3B:
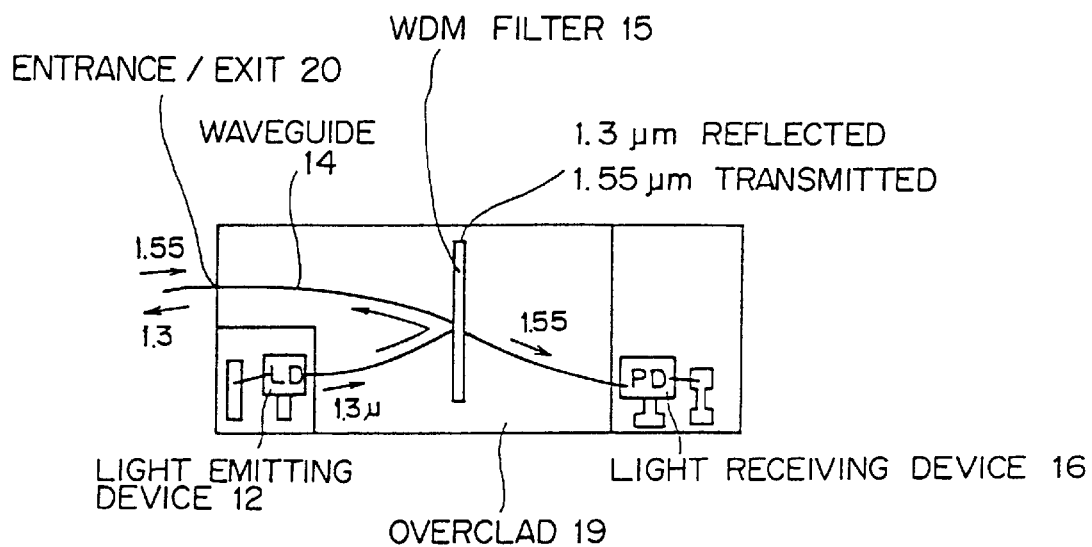

FIGS. 3A and 3B show an example of a hybrid-mounted optical device using a PLC platform according to the present invention.

As shown in FIG. 3A, a platform substrate 11 is, for example, a silicon substrate, and an insulation film 18 is formed on the substrate. The insulation film 18 is made of $SiO_2$, etc. Furthermore, an LED 12, a light receiving device 16 and an overclad 19, excluding a transmitting unit wiring pattern 13 and a receiving unit wiring pattern 17, is provided on the surface of this insulation layer 18. Accordingly, the insulation film 18 becomes the underclad of a waveguide 14. The overclad 19 is made of $SiO_2$ or the same substance as the insulation film, such as lithium niobate, etc. Then, a waveguide 14 for guiding light beams between the overclad 19 and the underclad is formed. The waveguide 14 is structured so as to guide light beams from the LED 12 to a WDM filter 15 provided in a groove in the overclad 19, and to guide optical signals transmitted and reflected by the WDM filter 15 to the light receiving device 16 and a light entrance/exit 20, respectively. The LED 12 is provided on the side of the WDM filter 15 where there is the entrance/exit 20 of the waveguide 14, and the light receiving device 16 is provided on the opposite side of the WDM filter. The LED 12 is driven by the current supplied from the transmitting unit wiring pattern 13, and the light receiving device 16 outputs electric signals corresponding to received optical signals to the receiving unit wiring pattern 17.

FIG. 3B shows the operation of the optical transmitting and receiving device shown in FIG. 3A.

The LED 12 transmits optical signals of a first wavelength (for example, 1.3 μm) to the waveguide 14. The WDM filter 15 is designed so as to reflect the optical signals of the first wavelength. The optical signals reflected by the WDM filter are outputted from the entrance/exit 20 of the waveguide 14.

On the other hand, optical signals of a second wavelength (for example, 1.55 μm) different from the first wavelength are used for signals received from the entrance/exit 20. The WDM filter 15 is designed to transmit optical signals of the second wavelength. Thus, the optical signals of the second wavelength received from the entrance/exit 20 pass through the WDM filter, and are received by the light receiving device 16. In this way, an optical transmitting and receiving device hybrid-mounting a transmitting unit and a receiving unit can be configured by using different wavelengths for outgoing and incoming optical signals.

In this configuration, the LED 12 is provided on the entrance/exit 20 side of the WDM filter 15. This is because when outgoing optical signals outputted from the LED 12 or incoming optical signals received from the entrance/exit 20 leak out from the waveguide 14, and an oscillation mode is generated over all the overclad 19 and underclad (insulation layer 18), this oscillation mode over all the overclad 19 and underclad is stray light which can be isolated by the WDM filter 15 to prevent the stray light from entering the light receiving device 16.

According to the configuration shown in this diagram, crosstalk between the transmitting and receiving sides due to stray light can be suppressed to a minimum.

Figure 4:
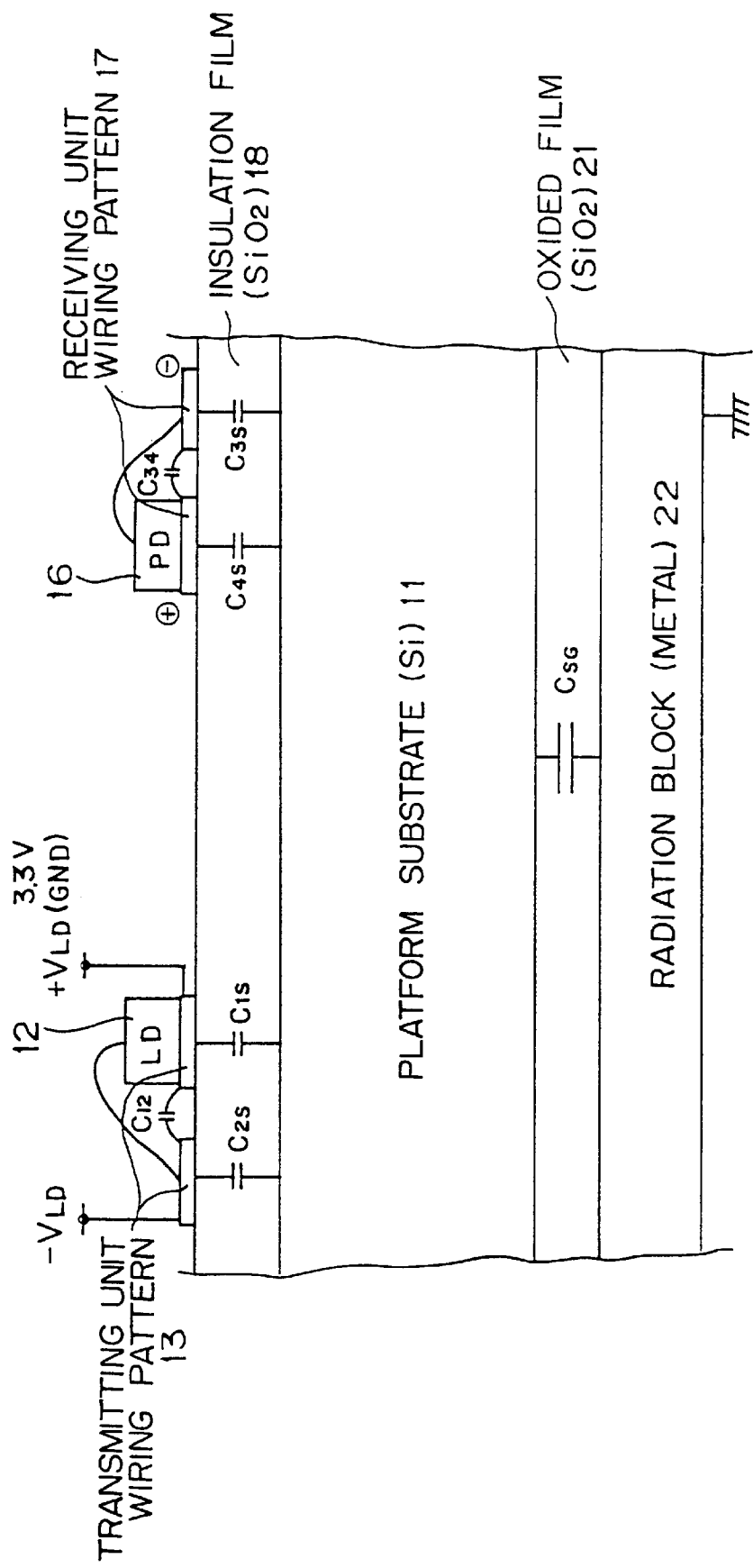
FIG. 4 explains the electrical crosstalk generating mechanism of an optical transmitting and receiving device and the prevention method (No. 1).
Figure 5:
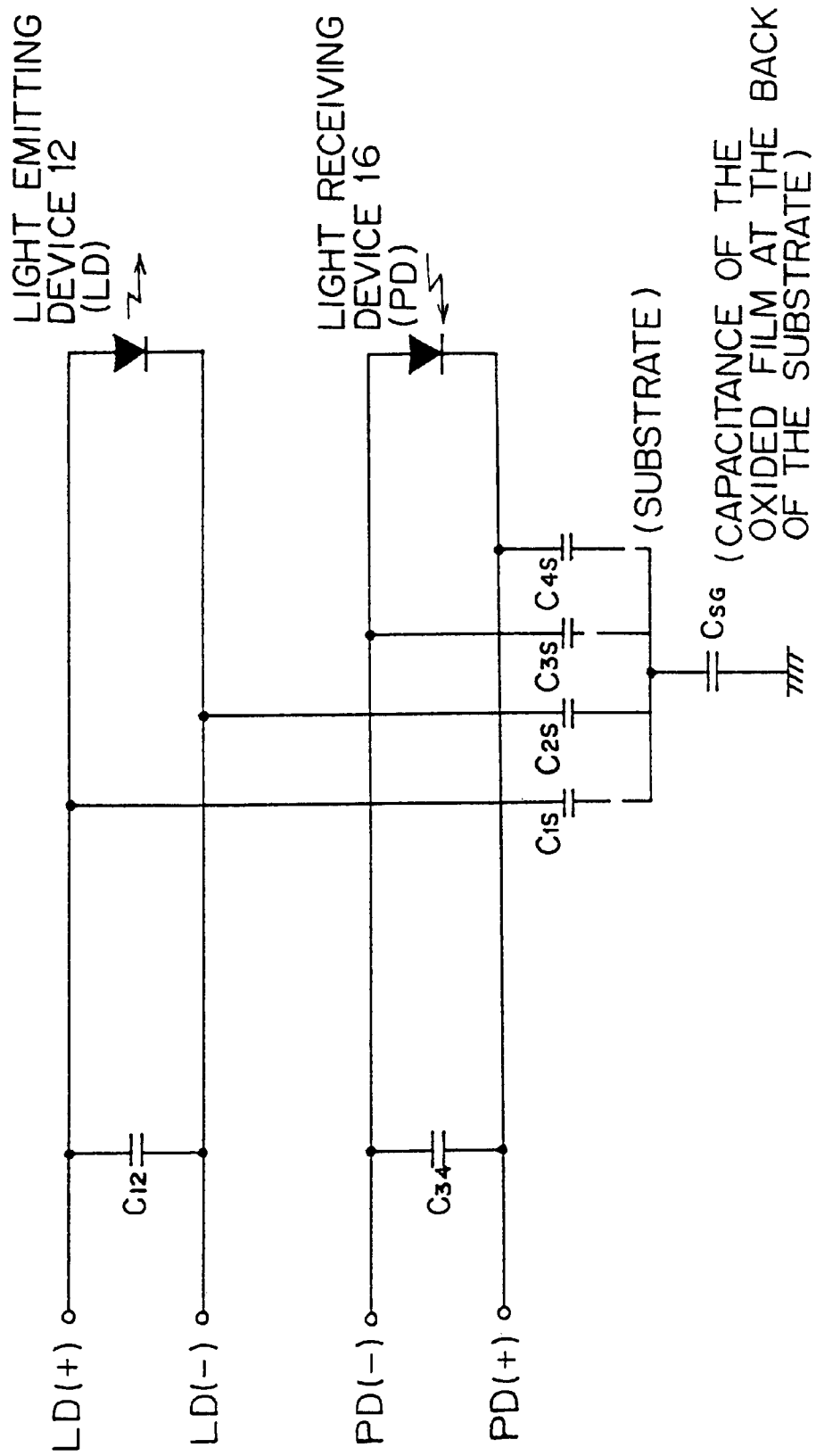
FIG. 5 explains the electrical crosstalk generating mechanism of an optical transmitting and receiving device and the prevention method (No. 2).

FIGS. 4 and 5 explain the electrical crosstalk generating mechanism of a hybrid optical transmitting and receiving device shown in FIGS. 3A and 3B and the prevention method. FIG. 4 is the cross sectional diagram of the optical transmitting and receiving device, and shows that there is parasitic capacitance. FIG. 5 shows the equivalent circuit model.

As shown in FIG. 4, first, parasitic capacitances $C_{12}$ and $C_{34}$ are generated in the transmitting unit wiring pattern 13 and the receiving unit wiring pattern 17, respectively. Since the parasitic capacitance does not form a route from the LED 12 to the light receiving device 16 as shown in the equivalent circuit of FIG. 5, this parasitic capacitance has no effect on crosstalk between the transmitting side and the receiving side. On the other hand, since the parasitic capacitance $C_{1S}$ and $C_{2S}$ between the platform substrate 11 and the transmitting unit wiring pattern 13, and the parasitic capacitance $C_{3S}$ and $C_{4S}$ between the platform substrate 11 and the receiving unit wiring pattern 17, form a route between the LED 12 and the light receiving device 16 as shown in the equivalent circuit of FIG. 5, this parasitic capacitance become a cause for generating crosstalk between the transmitting side and the receiving side. Experimentally, it is found that the influence of $C_{1S}$ is greater than the influence of $C_{2S}$, and the influence of $C_{3S}$ is greater than the influence of $C_{4S}$. Since the impedance value of the parasitic capacitance $C_{SG}$ possessed by a silicon dioxide film 21 plays a role of determining whether the current from the LED should flow to ground or to the light receiving device 16 as shown in the equivalent circuit of FIG. 5, the capacitance $C_{SG}$ becomes an important factor in the reduction of the electrical crosstalk.

Crosstalk is generated between the transmitting side and the receiving side since the driving current of the LED 12 leaks from the transmitting unit wiring pattern 13 to the receiving unit wiring pattern 17 via series capacitance ($C_{1S}$, $C_{S2}$, $C_{3S}$ or $C_{4S}$ in FIG. 4 or FIG. 5) formed between the transmitting unit wiring pattern 13 and the platform substrate 11 and between the receiving unit wiring pattern 17 and the platform substrate 11. Since the branching ratio of the current is determined by the ratio of the reciprocal of the impedance, it is necessary to increase the impedance ($1/j\omega C_{1S}$, $1/j\omega C_{2S}$, $1/j\omega C_{3S}$ and $1/j\omega C_{4S}$) on the side connected to the receiving unit at each branching point and to reduce the impedance on the side not connected to the receiving unit ($1/j\omega C_{SG}$) at each branching point in order to reduce the current leaking to the receiving unit.

In the present invention, the impedance of the route for crosstalk is increased by increasing the impedance between the transmitting unit wiring pattern 13 and the substrate 11, and the impedance between the receiving unit wiring pattern 17 and the substrate 11. The crosstalk current leaking to the substrate 11 is grounded by connecting the substrate 11 to a constant potential portion such as ground, etc.

Embodiments of the present invention and the manufacturing method are described below with reference to FIGS. 6 through 18.

In these embodiments silicon is used for the substrate. The use of an Si substrate has advantages, such as being capable of accurately forming guiding grooves for optical fibers, ferrule, etc. using anisotropic etching, inexpensive material cost, etc.

Figure 6:
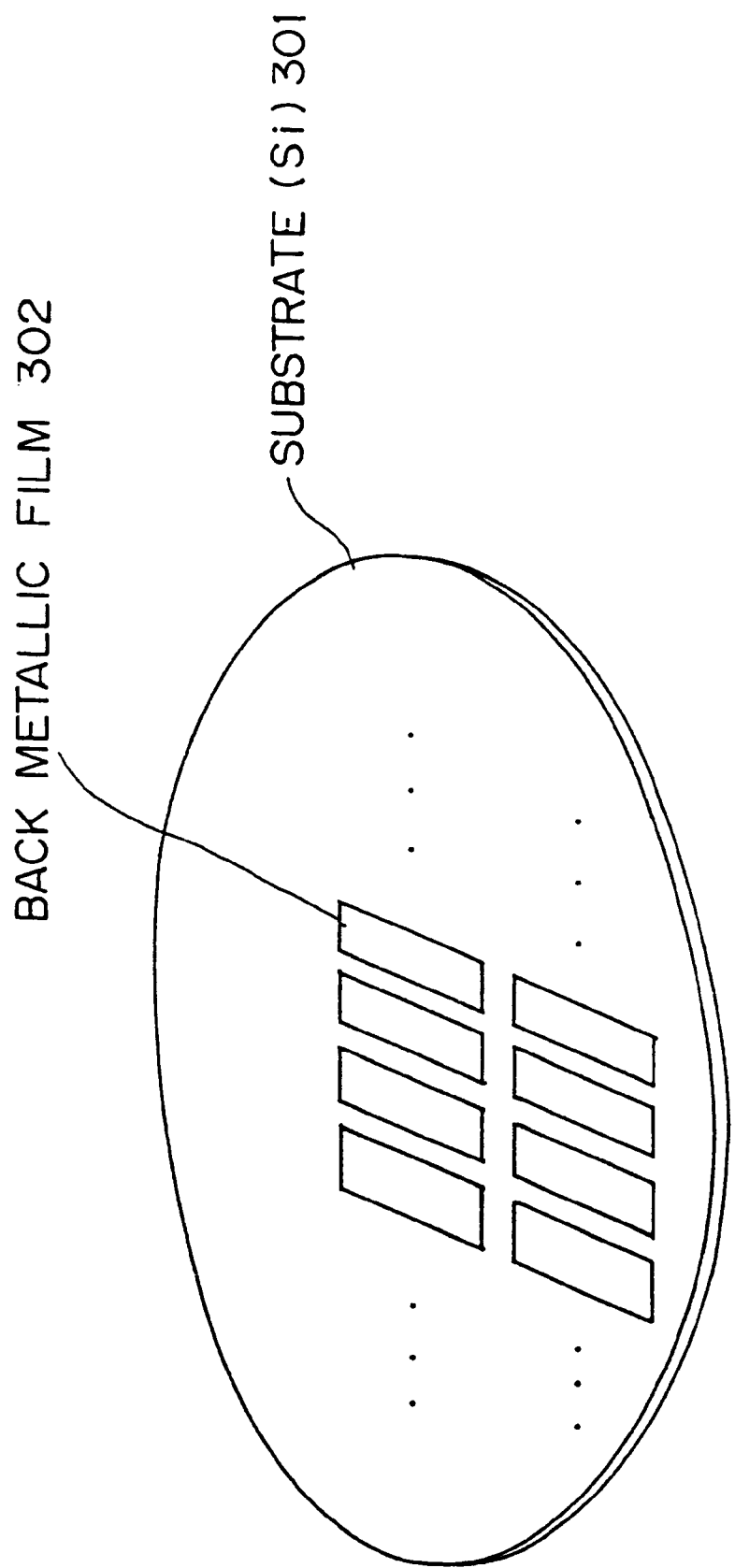
FIG. 6 explains one embodiment of the present invention and the manufacturing method (No. 1).

As shown in FIG. 6, Ti (0.1 $\mu$m), Ni (0.1 $\mu$m) and Au (1 $\mu$m) are vaporized on the back of the Si substrate 301 as a back metallic film 302. This is needed to electrically connect the Si substrate to a constant potential portion such as ground, etc. and to make the substrate play a role in electrostatic shielding. The back metallic film 302 may be vaporized over all the back of the substrate, or only over the portions used for the devices.

It is effective in reinforcing the shielding effect of the substrate to dope a p type substrate and an n type substrate with a high density p type impurity and a high density n type impurity, respectively, and forming an ohmic contact prior to the vaporization of the back metallic film 302. At this moment, since a thin silicon dioxide film is formed at the back of the substrate 301 as described before, it is recommended to remove the silicon dioxide film by cleaning the back of the substrate 301 using fluoric acid, etc. Then, the above-mentioned back metallic film 302 is formed before a new silicon dioxide film is generated. Since by grounding the back metallic film 302 the whole substrate can be kept at a constant potential, and the current leaking from the LD can be eliminated, the flow of leakage current to the PD can be suppressed, and thereby the crosstalk can be reduced.

Figure 7:
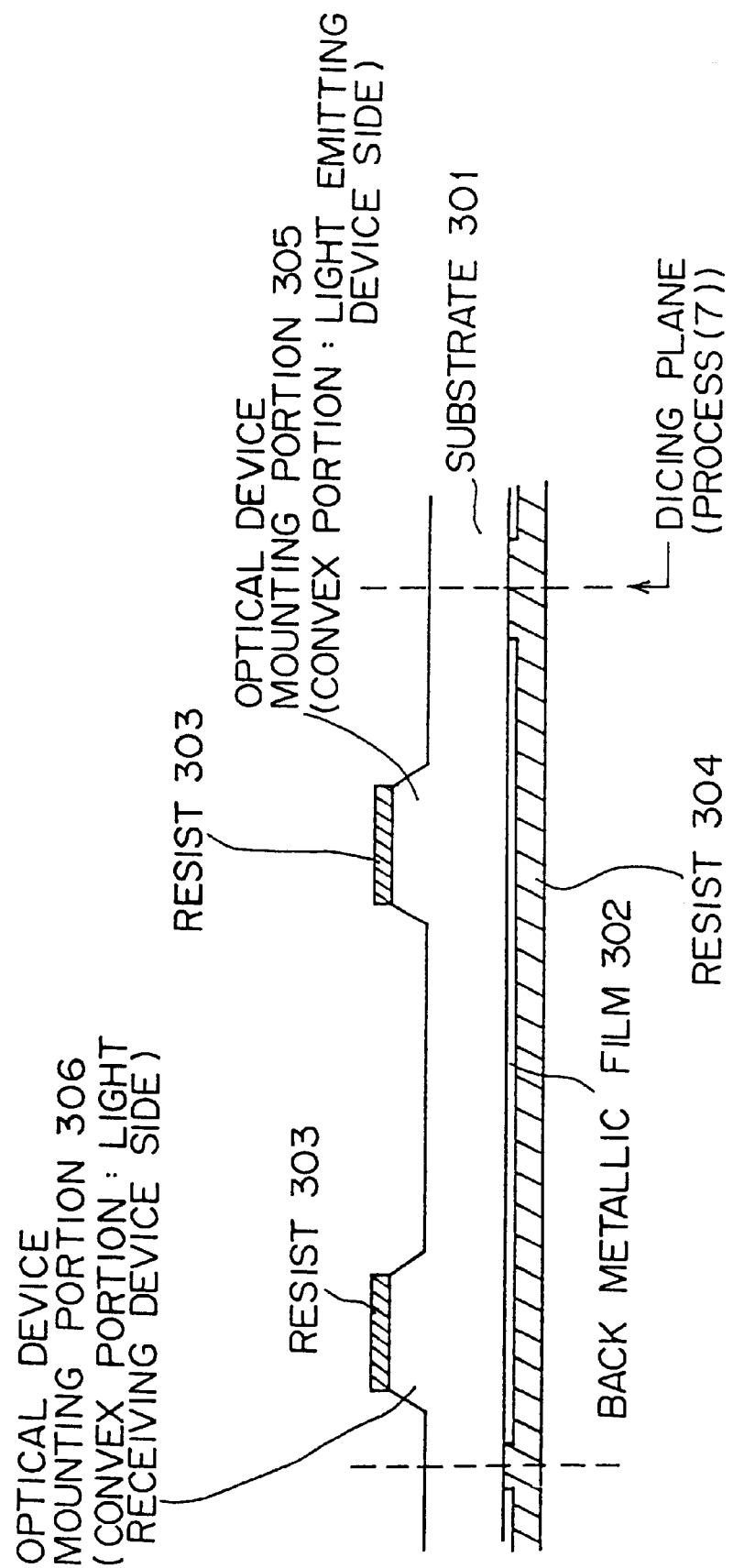
FIG. 7 explains one embodiment of the present invention and the manufacturing method (No. 2).

Then, as shown in FIG. 7, resist 303 is applied to optical device mounting portions 305 and 306 on the surface of the Si substrate 301 using a photo lithography technology, and the other portions of the surface of the Si substrate 301 are etched approximately 20 $\mu$m deep using a KOH solution, etc. In this case, the metallic film is prevented from being etched by using a resist 304. Thus, convex portions 305 and 306 are formed at the optical device mounting portions of the Si substrate.

Figure 8:
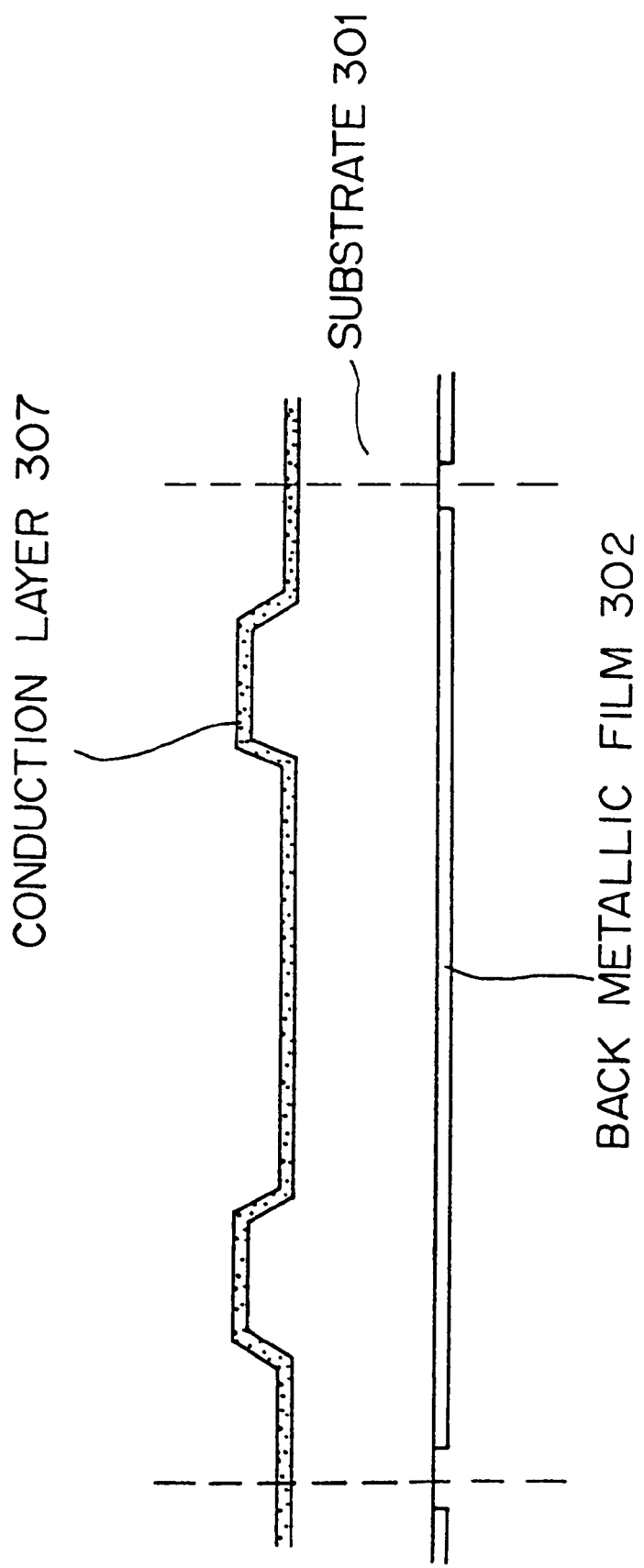
FIG. 8 explains one embodiment of the present invention and the manufacturing method (No. 3).

In the process shown in FIG. 8, after the resist 303 and 304 are removed, an n type impurity such as boric acid, etc. and a p type impurity such as phosphorus, etc. are doped on the surface of the substrate 301, for example, using a vapor diffusion method, etc. to form a conduction layer 307.

When the conduction layer 307 is formed over all the surface of the substrate as shown in FIG. 8, there is no need for a mask layer.

Figure 9:
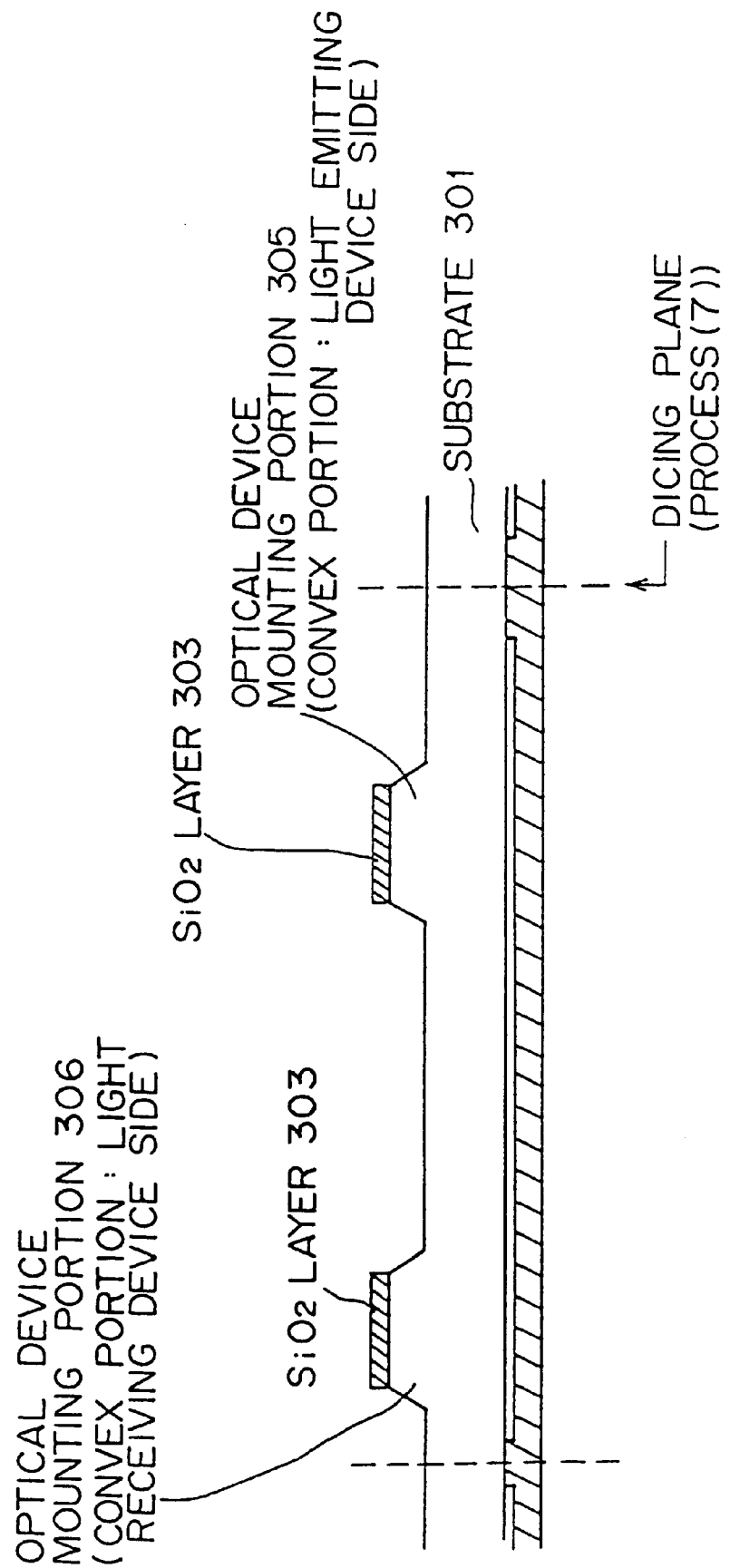
FIG. 9 explains variant of one embodiment of the present invention and the manufacturing method (No. 1).

In another method to form optical device mounting portions, as shown in FIG. 9, SiO$_2$ layer 303 is applied to optical device mounting portions 305 and 306 on the surface of the Si substrate 301 using a photo lithography technology, and the other portions of the surface of the Si substrate 301 are etched approximately 20 $\mu$m deep using a KOH solution, etc. Thus, convex portions 305 and 306 are formed at the optical device mounting portions of the Si substrate.

Figure 10:
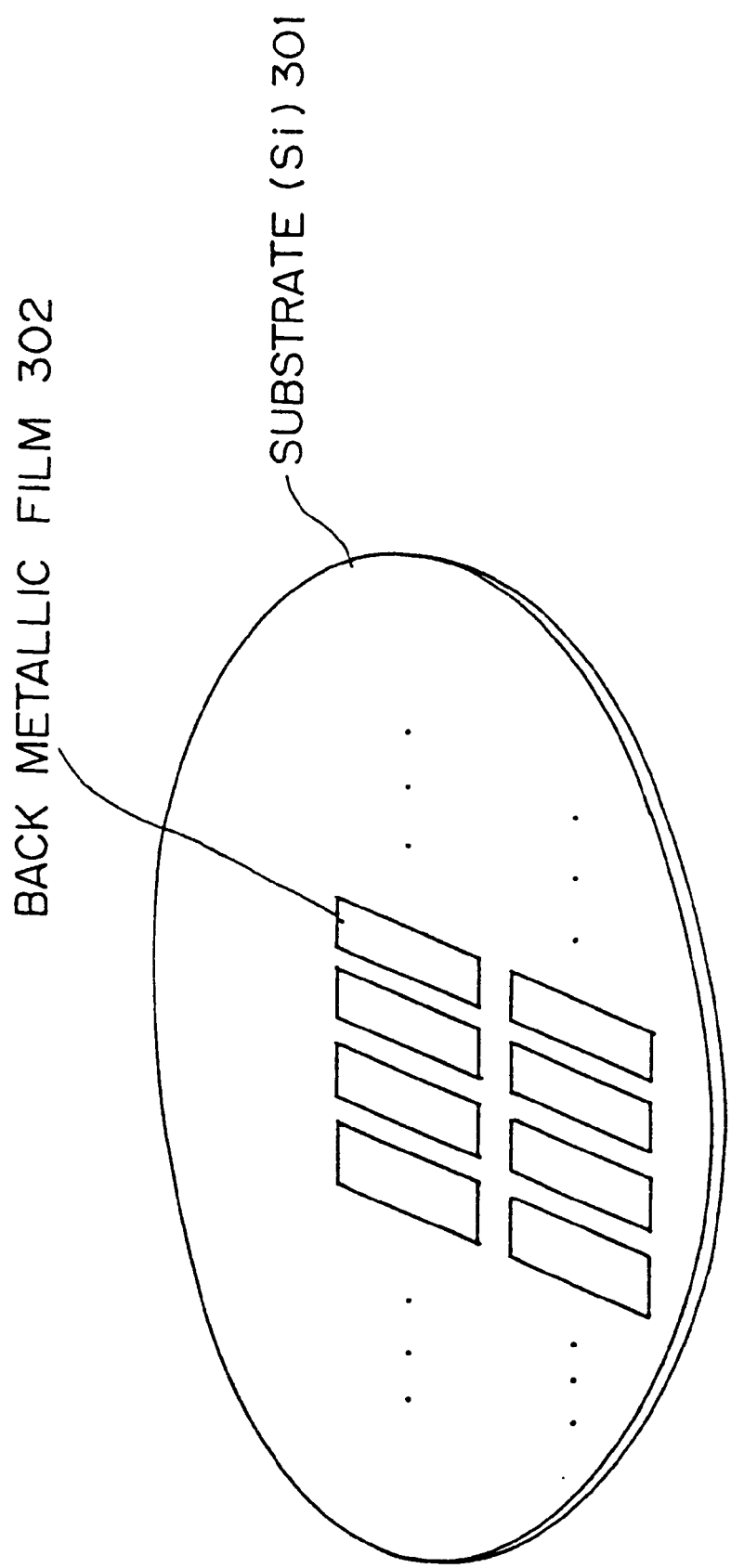
FIG. 10 explains variant of one embodiment of the present invention and the manufacturing method (No. 2).

Then, as shown in FIG. 10, Ti (0.1 $\mu$m), Ni (0.1 $\mu$m) and Au (1 $\mu$m) are vaporized on the back of the Si substrate 301 as a back metallic film 302. This is needed to electrically connect the Si substrate to a constant potential portion such as ground, etc. and to make the substrate play a role in electrostatic shielding. The back metallic film 302 may be vaporized over all the back of the substrate, or only over the portions used for the devices.

It is effective in reinforcing the shielding effect of the substrate to dope a p type substrate and an n type substrate with a high density p type impurity and a high density n type impurity, respectively, and forming an ohmic contact prior to the vaporization of the back metallic film 302. At this moment, since a thin silicon dioxide film is formed at the back of the substrate 301 as described before, it is recommended to remove the silicon dioxide film by cleaning the back of the substrate 301 using fluoric acid, etc. Then, the above-mentioned back metallic film 302 is formed before a new silicon dioxide film is generated. Since by grounding the back metallic film 302 the whole substrate can be kept at a constant potential, and the current leaking from the LD can be eliminated, the flow of leakage current to the PD can be suppressed, and thereby the crosstalk can be reduced.

Figure 11:
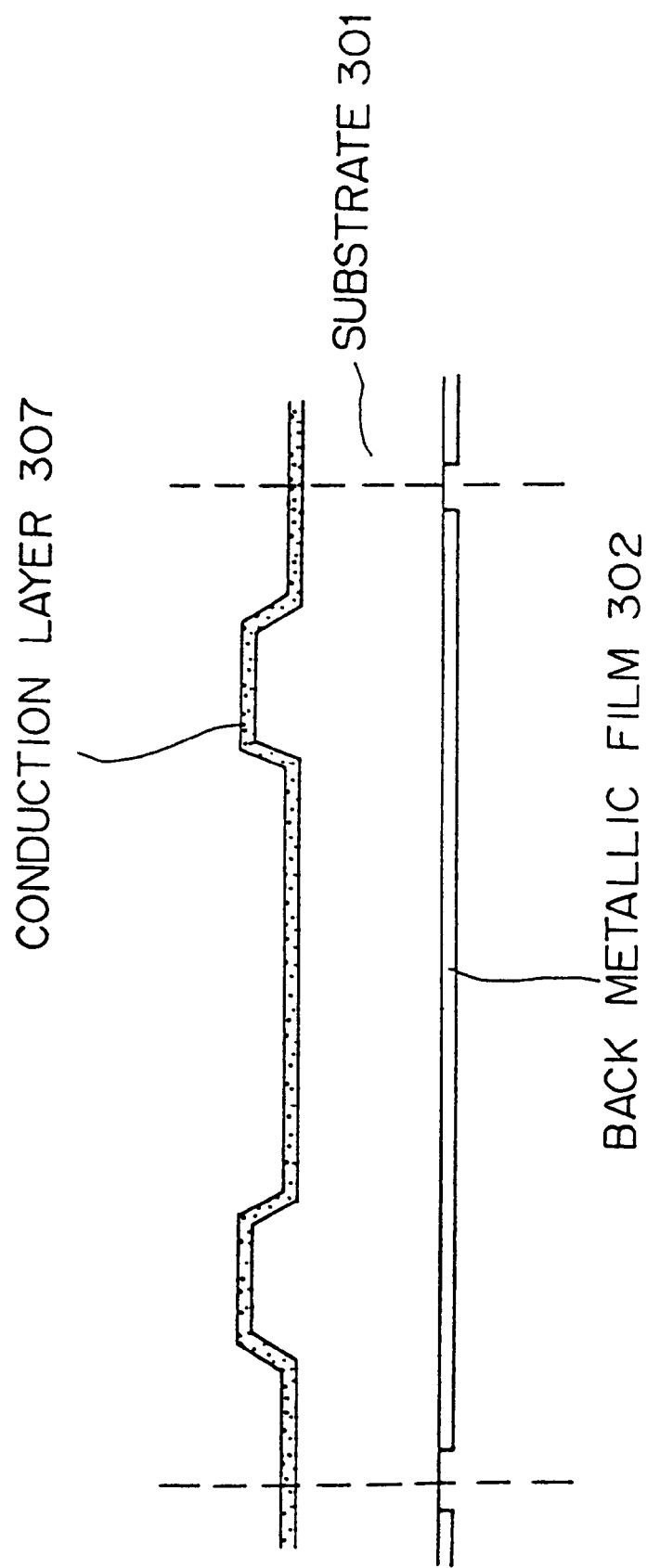
FIG. 11 explains variant of one embodiment of the present invention and the manufacturing method (No. 3).

In the process shown in FIG. 11, after the resist 303 and 304 are removed, an n type impurity such as boric acid, etc. and a p type impurity such as phosphorus, etc. are doped on the surface of the substrate 301, for example, using a vapor diffusion method, etc. to form a conduction layer 307.

When the conduction layer 307 is formed over all the surface of the substrate as shown in FIG. 11, there is no need for a mask layer.

Figure 12:
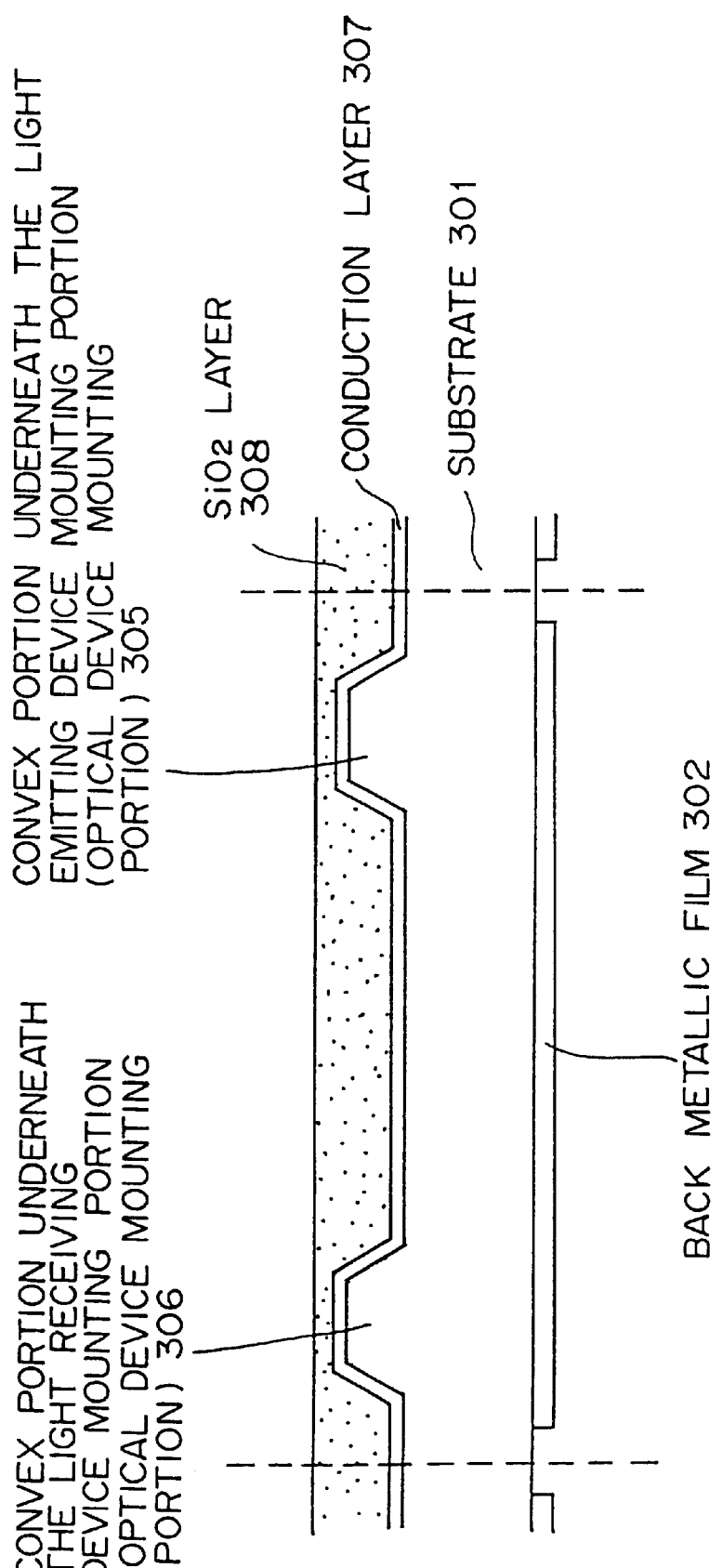
FIG. 12 explains one embodiment of the present invention and the manufacturing method (No. 4).

Then, as shown in FIG. 12, an SiO$_2$ layer 308 over 30 $\mu$m thick is deposited using a flame deposition method, etc., and the surface of the SiO$_2$ layer 308 is leveled by polishing. At this time, an SiO$_2$ film 1 $\mu$m thick is left above the convex portions 305 and 306 for mounting the optical devices, particularly on the LED mounting portion 305 which generates a lot of heat.

Alternatively, in the polishing process the substrate can be polished until the Si substrate of the optical device mounting portions 305 and 306 is exposed, and after that a new SiO$_2$ film approximately 1 $\mu$m thick can be formed again.

The SiO$_2$ layer 308 formed in the process shown in FIG. 12 becomes the underclad of the optical waveguide and the insulation layer between the electric wiring patterns and the Si substrate.

Figure 13:
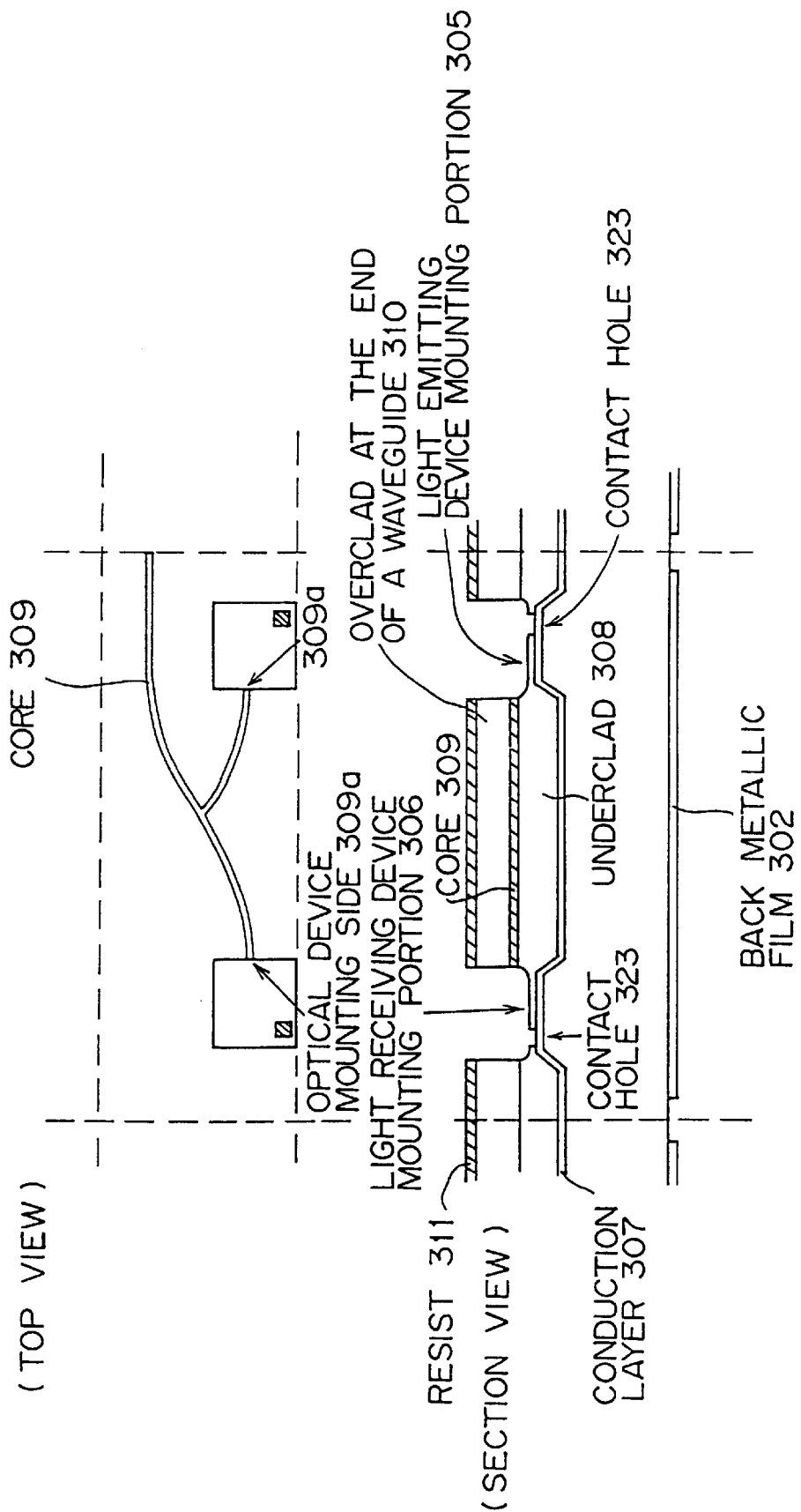
FIG. 13 explains one embodiment of the present invention and the manufacturing method (No. 5).

Then, in the process shown in FIG. 13, a core 309 of the waveguide and an overclad 310 are formed in succession, and the waveguide ends 309a are formed on the optical device mounting portion sides.

An $SiO_2$ layer doped with Ge, Ti, etc. is laminated approximately 8 μm thick, portions to be left as a core 309 are covered with resist (not shown in the diagram), and the $SiO_2$ layer is etched using RIE (Reactive Ion Etching) with this resist as a mask until the underclad 308 is exposed.

Further, an $SiO_2$ layer is laminated approximately 30 μm thick, and portions other than the optical device mounting portions 305 and 306 are covered with resist 311. The $SiO_2$ layer to be the optical device mounting portions is etched using RIE until the $SiO_2$ layer on the Si substrate convex portions of the optical device mounting portions 305 and 306 formed in the process shown in FIG. 12 becomes approximately 1 μm thick. Alternatively, after etching the layer until the Si (silicon) of the Si substrate convex portions of the optical device mounting portions 305 and 306 is exposed, a heat-oxidized film approximately 1 μm thick can be formed.

At this time, contact holes 323 to the conduction layer 307 are provided in the optical device mounting portions.

Figure 14:
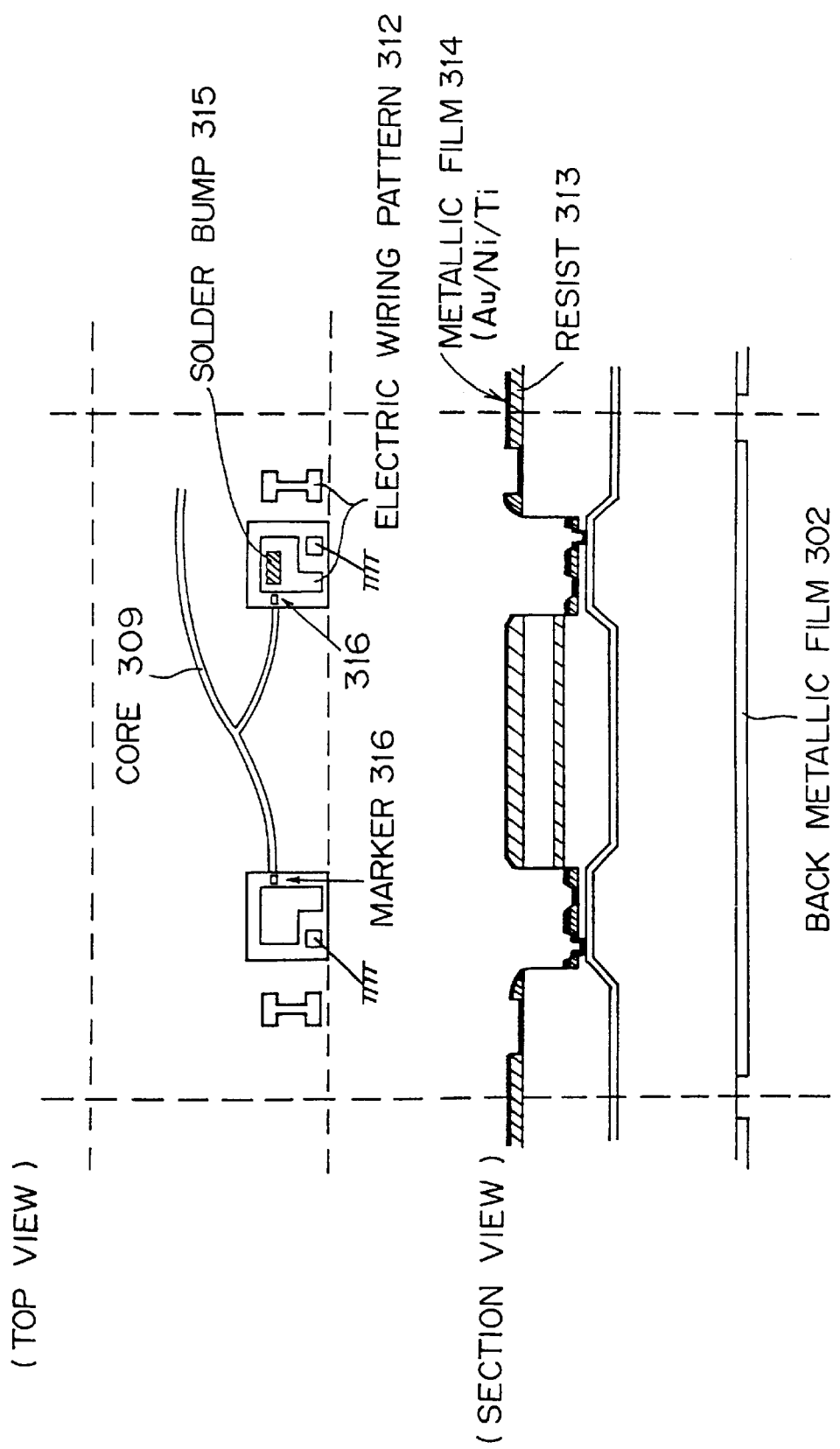
FIG. 14 explains one embodiment of the present invention and the manufacturing method (No. 6).

Next, as shown in FIG. 14, electric wiring patterns 312 are formed using a lift-off method.

First, resist 313 is applied over all the surface of the substrate approximately 2 μm thick (the resist must be thicker than the electric wiring patterns 314 to be formed), and the resist 313 of portions to be patterned is removed. Then, for example, Ti (0.1 μm), Ni (0.1 μm) and Au (1 μm) 314 are vaporized over the surface of the substrate in that order, and surplus vaporized metallic films are removed together with the resist 313.

Solder bumps made of gold, tin, etc. can also be formed in the optical device mounting portions using a lift-off method in the same way as described above, if necessary.

Aligning markers 316 can also be formed in the optical device mounting portions simultaneously with the electric wiring patterns 314, and optical elements can be aligned by referring to these markers when mounting the devices.

Figure 15:
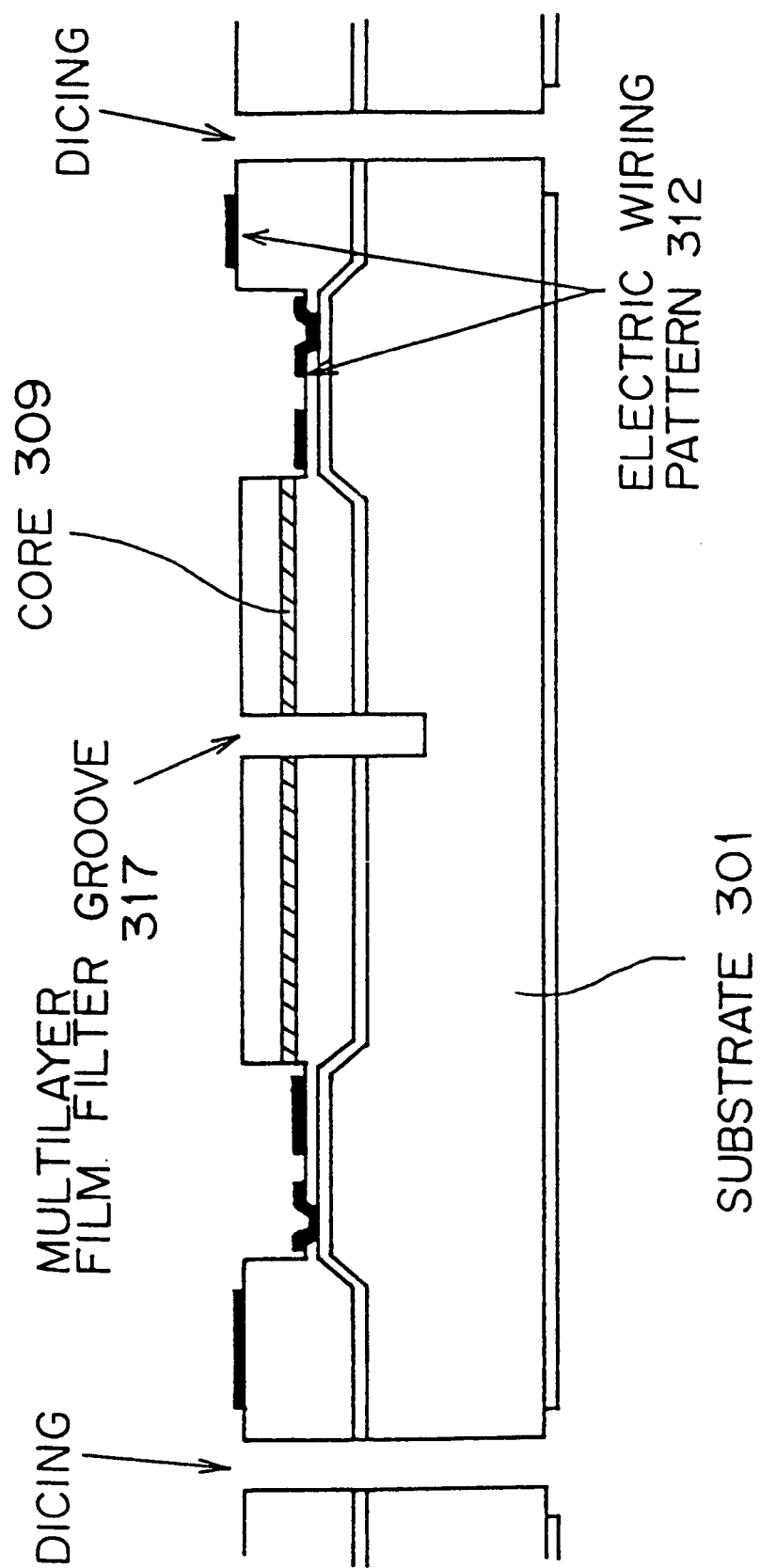
FIG. 15 explains one embodiment of the present invention and the manufacturing method (No. 7).

In the process shown in FIG. 15 a groove 317 for inserting a multilayer film filter is formed using a dicing saw, and the Si substrate 301 is cut into individual platforms. The groove 317 is formed so as to cross the point where an optical waveguide is branched, and the depth is equal to or greater than the depth of the provided underclad.

Figure 16:
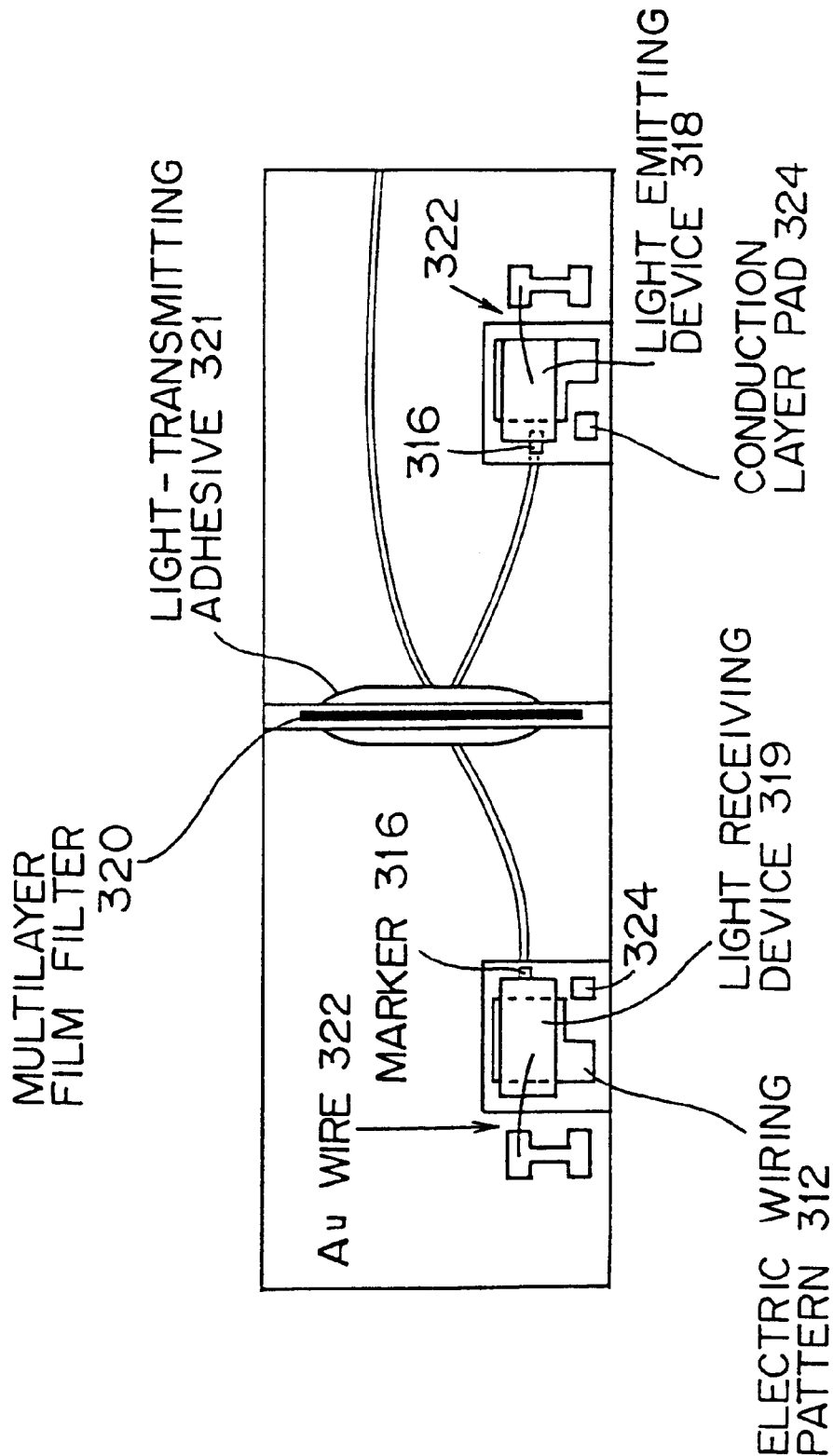
FIG. 16 explains one embodiment of the present invention and the manufacturing method (No. 8).

In the process shown in FIG. 16, optical devices 318 and 319 are aligned by referring to the aligning markers formed in the optical device mounting portions, as described above, and the optical devices 318 and 319 are installed onto the electric wiring patterns 312 by heating the platform. A multilayer film filter 320 is inserted, and is fixed using a light-transmitting adhesive 321. In this embodiment, first, the optical devices 318 and 319 are mounted using a AuSn solder bumps 315 (FIG. 14) formed on the electric wiring patterns 312, and then the light receiving device 319 is mounted using a conductive adhesive. After the optical devices are mounted, the optical devices and the electric wiring patterns are connected with each other using wires 322. Then, conduction layer pads 324 are provided. The conduction layer pads 324 are electrically connected to the conduction layer 307 through the contact holes 323, and the pads 324 are further connected to the terminals of the package later.

Figure 17:
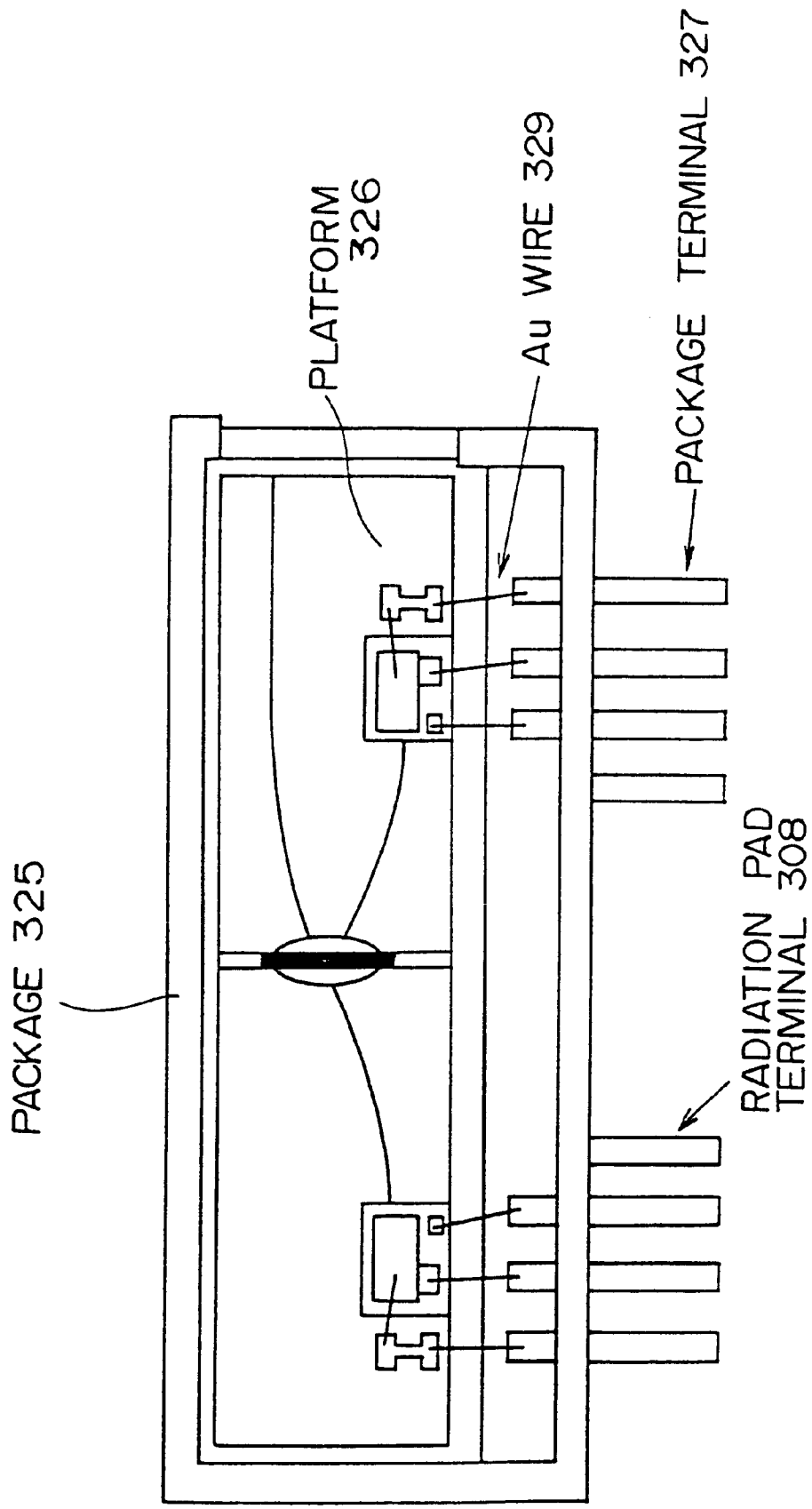
FIG. 17 explains one embodiment of the present invention and the manufacturing method (No. 9).

In the process shown in FIG. 17, a platform 326 is fixed to a package 325, the electric wiring patterns 312 of the platform, the conduction layer pads 324 (FIG. 16) and the terminals 327 of the package 325 are connected with each other using Au wires 329. The metallic film 302 at the back of the substrate and the radiation pads (at the bottom of the platform 326) are stuck together using a conductive adhesive such as silver paste, etc.

Figure 18:
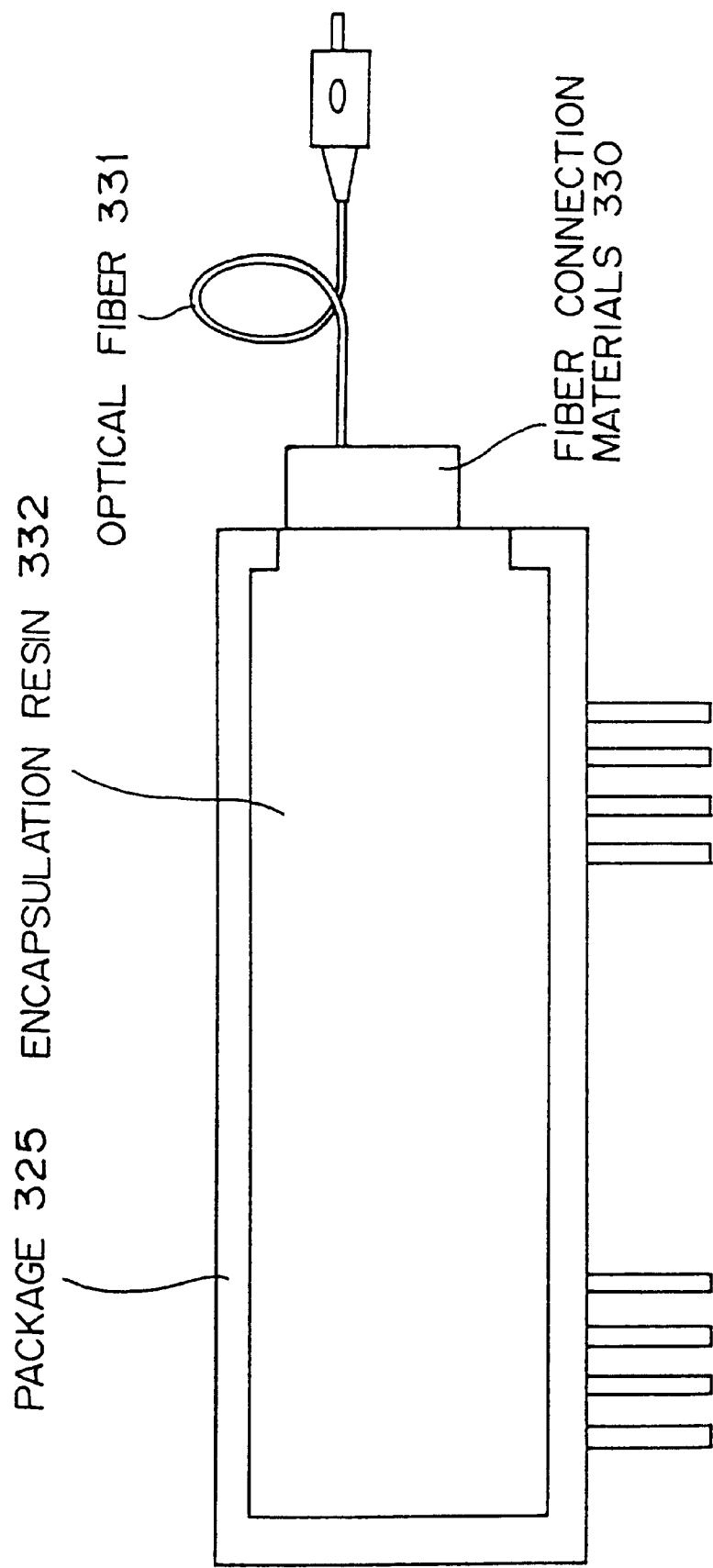
FIG. 18 explains one embodiment of the present invention and the manufacturing method (No. 10).

In the process shown in FIG. 18, the cores of optical fiber 331 are aligned to the optical waveguide, and the optical fibers are connected using a thermosetting adhesive, UV-hardening adhesive, etc. After the optical fiber is connected to the optical waveguide using a fiber connecting material 330, the platform is encapsulated using a resin 332, etc.

In the optical transmitting and receiving device described above with reference to FIGS. 6 through 18, since the conduction layer 307 is formed on the substrate 301, and this conduction layer 307 is grounded through the contact hole 323, the currents leaking from the LED 318 are grounded, and the crosstalk to the light receiving device 319 can be reduced.

The electrical crosstalk can also be reduced by improving the insulation state between the electric wiring pattern 312 connected to the LED 318 or the light receiving device 319, etc. and the substrate 301, by leaving the $SiO_2$ layer underneath the LED 318 and the light receiving device 319 rather thick and forming a heat-oxidized film.

As described above, according to this embodiment, since the electrical crosstalk can be suppressed, a more reliable hybrid-mounted optical transmitting and receiving device can be provided.

Figure 19:
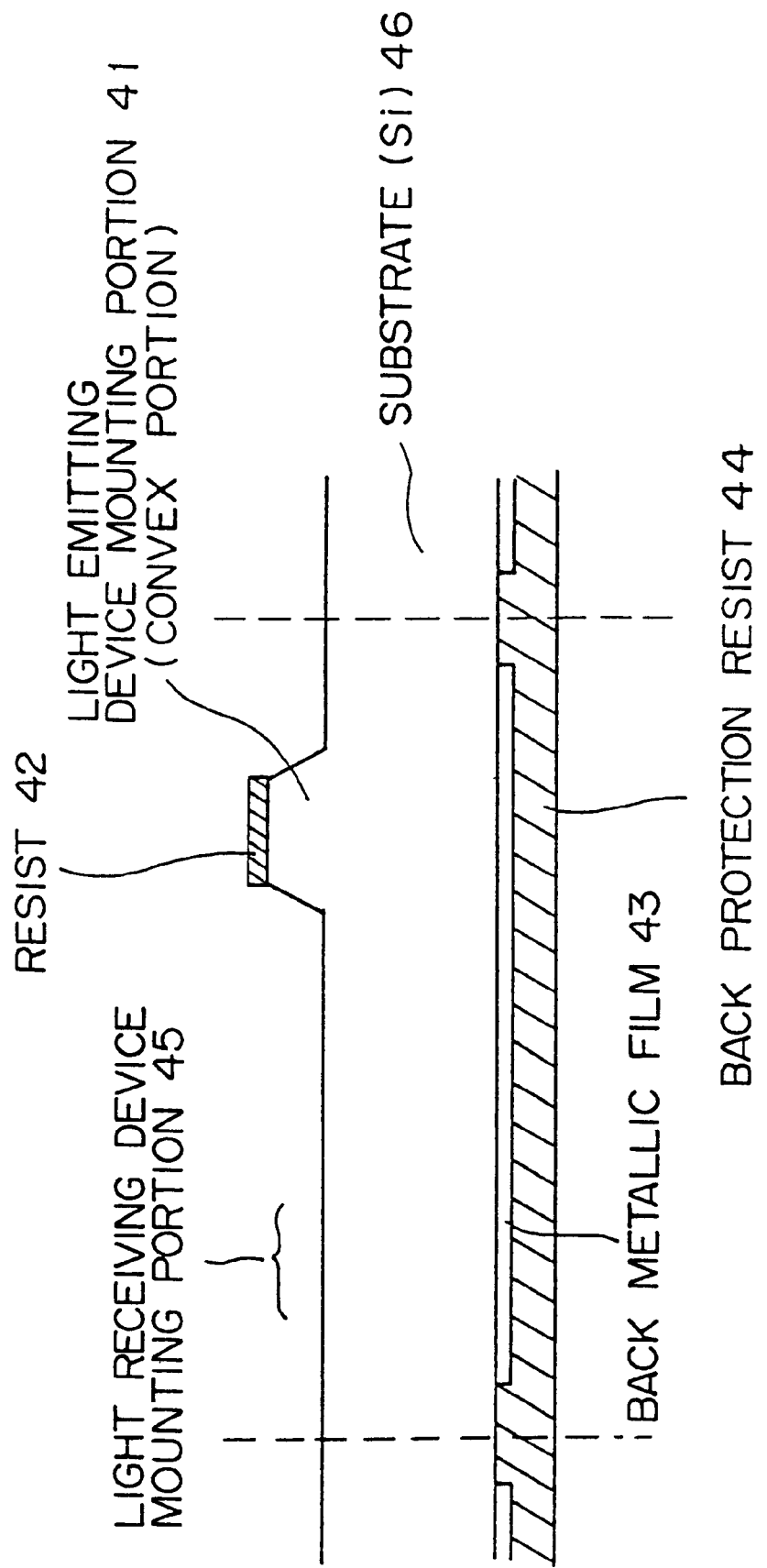
FIG. 19 explains another embodiment of the present invention (No. 1).
Figure 21:
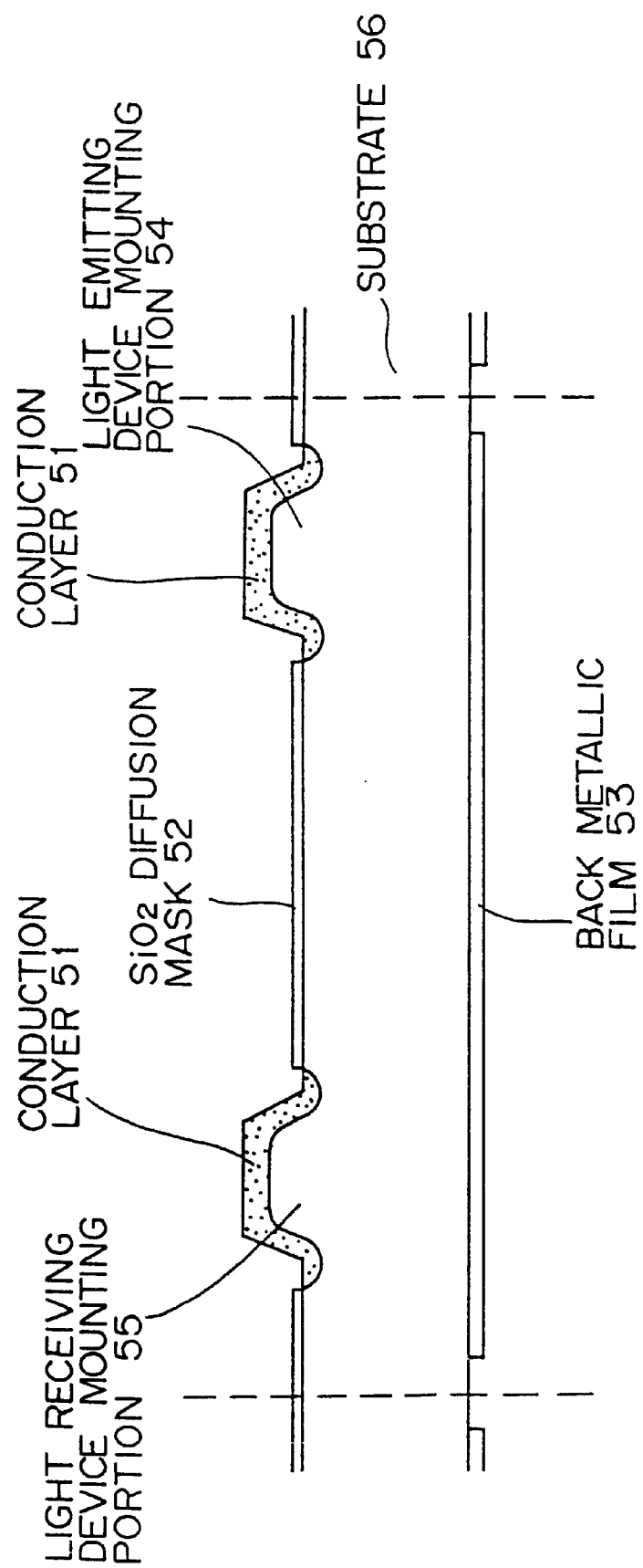
FIG. 21 explains another embodiment of the present invention (No. 2).

FIGS. 19 and 21 explain another embodiment of the present invention.

If the Si substrate 46 including the light receiving device mounting portion 45 is etched with resist 42 leaving only the LED mounting portion 41, as shown in FIG. 19, a thick insulation layer can be formed at the bottom of the light receiving device mounting portion 45 in the process shown in FIG. 12.

Thus, since the insulation layer at the bottom of the light receiving device is thick, thereby more effective insulation can be obtained.

A back protection resist 44, provided so as to cover the back metallic film 43 shown in FIG. 19, is provided to prevent the back metallic film 43 from being etched when etching the Si substrate 46. For etching, for example, the above-mentioned KOH is used.

Figure 20:
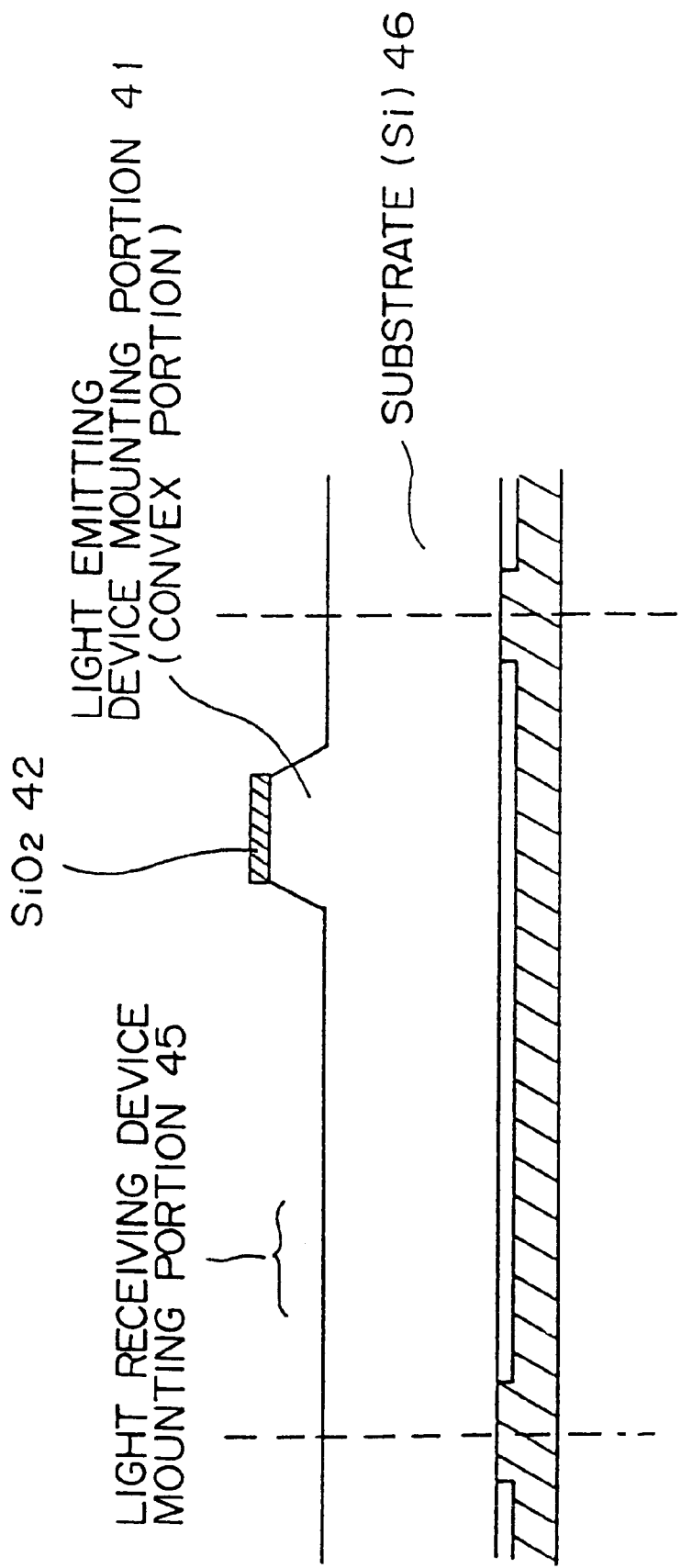
FIG. 20 explains variant of another embodiment of the present invention.

If the Si substrate 46 including the light receiving device mounting portion 45 is etched with $SiO_2$ 42 leaving only the LED mounting portion 41, as shown in FIG. 20, a thick insulation layer can be formed at the bottom of the light receiving device mounting portion 45 in the process shown in FIG. 12.

Thus, since the insulation layer at the bottom of the light receiving device is thick, thereby more effective insulation can be obtained.

After removing the $SiO_2$ mask with HF, the back metallic film is vaporized on the back of the substrate.

Although in the embodiment of FIGS. 6 to 18 a conduction layer is formed over all the surface of the substrate 56, as shown in the process shown in FIG. 8, as shown in FIG. 21, there is no need to form a conduction layer over all the surface of the substrate 56 when a contact hole for grounding is provided in the light receiving device mounting portion 55 and the LED mounting portion 54. In this case, it is sufficient if the conduction layer is formed only in the light receiving device mounting portion 55 and the LED mounting portion 54.

For this reason, in the embodiment shown in FIG. 21, a conduction layer 51 is selectively formed only on the LED mounting portion 54 and the light receiving device mounting portion 55. When the substrate 56 is p type Si, the conduction layer is formed, for example, by doping the substrate 56 with boron, etc. When the substrate 56 is n type Si, the conduction layer is formed, for example, by doping the substrate 56 with phosphorus, etc.

To selectively dope only the LED mounting portion 54 or the light receiving device mounting portion 55, an impurity is doped after a mask layer 52 made of $SiO_2$ is formed using a photo lithography technology. That is, doping is performed using boron or phosphorus.

A pn junction can be formed at the optical device mounting portions 54 and 55 by doping the substrate 56 with an impurity the reverse of the conduction type of the substrate 56. That is, if the substrate 56 is p type Si, the conduction type of both the LED mounting portion 54 and the light receiving device mounting portion 55 is made n type. When the voltage generated in the LED mounting portion 54 and the light receiving device mounting portion 55 is higher than ground, this configuration is effective. Because by making the conduction type of both the LED mounting portion 54 and the light receiving device mounting portion 55 n type, the pn junction is reversely biased by the voltage applied between the back of the substrate 56 and the optical device mounting portions, and it becomes difficult for current to flow through the pn junction. Conversely, when the voltage generated in the LED mounting portion 54 and the light receiving device mounting portion 55 is lower than ground, n type Si is used for the substrate 56, and the conduction type of both the LED mounting portion 54 and the light receiving device mounting portion 55 is made p type. Thus, since, as described above, the pn junction is reverse-biased by the voltage applied between the back of the substrate 56, and the LED mounting portion 54 and the light receiving device mounting portion 55, the current flowing through this pn junction can be eliminated. Accordingly, the current from the LED provided in the LED mounting portion 54 can be prevented from flowing as crosstalk into the light receiving device provided in the light receiving device mounting portion 55 through the substrate 56. In this way, since the crosstalk can be prevented by applying a reverse bias to the pn junction, there is no need of a configuration for connecting the conduction layer 307 to a constant potential, as required in the previous embodiment.

Alternatively, both sides of the substrate can also be doped in the process shown in FIG. 7. In this case, the process can also be arranged so that the conduction layer is left only on the convex surface of the optical device mounting portions on the surface of the substrate in the etching process shown in FIG. 7.

As described above, a crosstalk route is made to have a high impedance by utilizing the inverse direction characteristic of the pn junction or increasing the resistance at the bottom of the optical device mounting portions of the substrate. Alternatively, signals of the LED leaked to the substrate are grounded, etc. through a low resistance layer (conduction layer) formed beneath the insulation film 18 shown in FIG. 3A. As a result, the crosstalk from the LED to the light receiving device can be reduced.

According to the above-mentioned embodiments, low crosstalk can be realized in a miniature optical transmitting and receiving device hybrid-mounting an LED and a light receiving device, and thereby a miniature optical transmitting and receiving device for an ATM-PON can be implemented.

A layer made of a plastic waveguide material such as polyimide, etc. can also be formed instead of the $SiO_2$ layer formed above. Using an insulating material such as heat-conductive SiC, diamond, etc. has an advantage that the heat radiation of an LED generating a lot of heat can be secured even if a thick insulation layer is used to reduce the parasitic capacitance of the LED mounting electrodes.

FIGS. 22 through 29 show an embodiment in the case where SiC or a diamond layer are formed at the bottom of an LED mounting portion or a light receiving device mounting portion and the manufacturing method.

Figure 22:
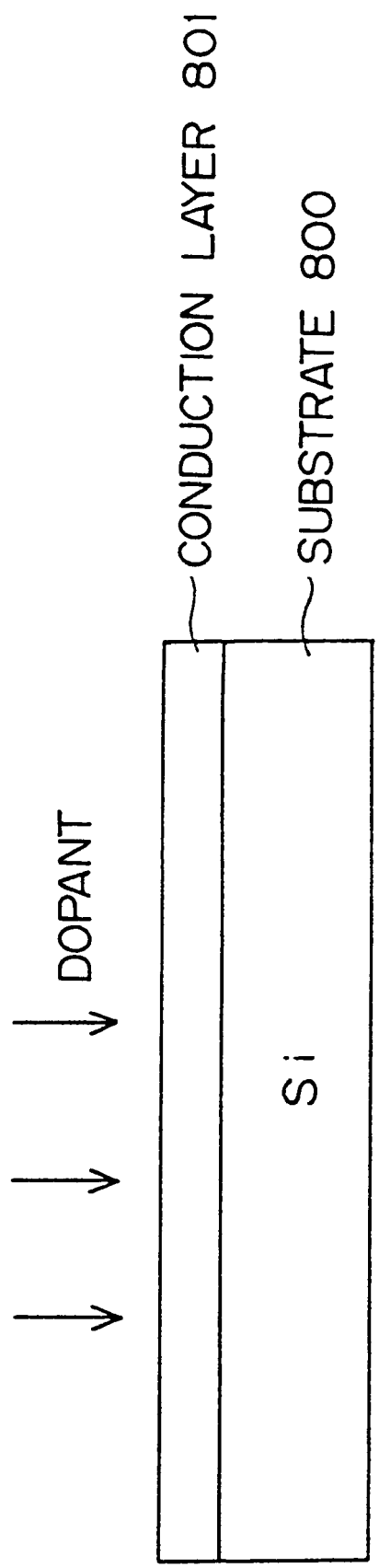
FIG. 22 explains an embodiment in the case where an SiC or diamond layer is formed at the bottom of an LED mounting portion or a light receiving device mounting portion and the manufacturing method (No. 1).
Figure 23:
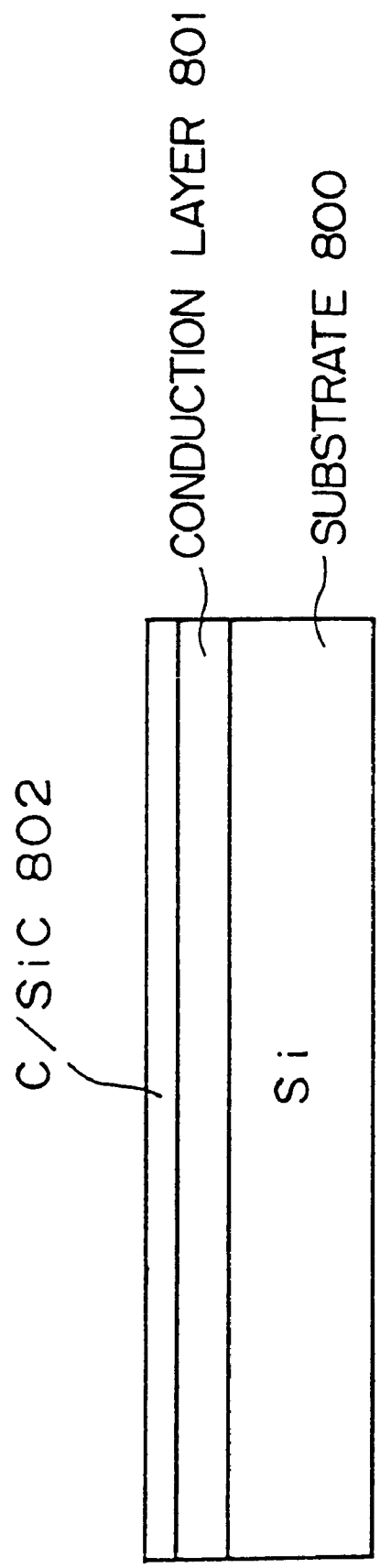
FIG. 23 explains an embodiment in the case where an SiC or diamond layer is formed at the bottom of an LED mounting portion or a light receiving device mounting portion and the manufacturing method (No. 2).
Figure 24:
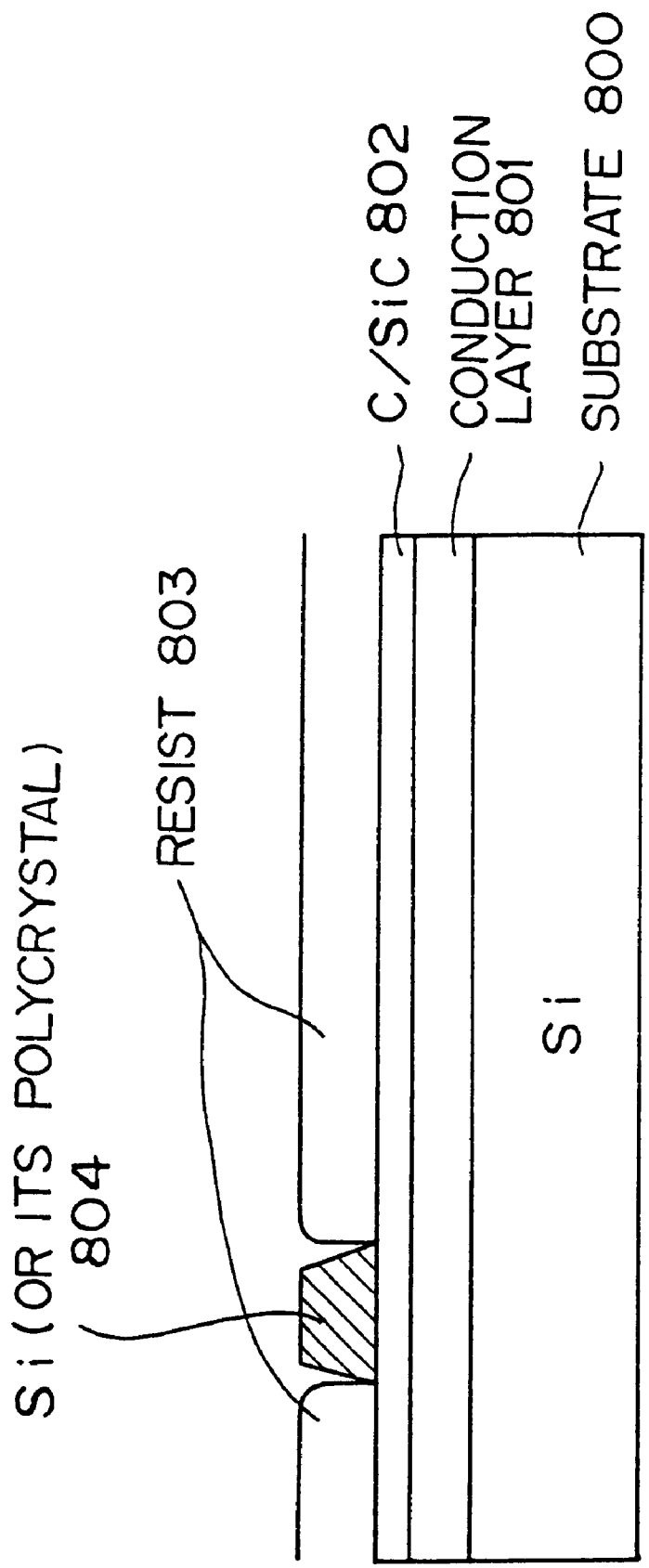
FIG. 24 explains an embodiment in the case where an SiC or diamond layer is formed at the bottom of an LED mounting portion or a light receiving device mounting portion and the manufacturing method (No. 3).

First, as shown in FIG. 22, a dopant is applied to the top of an Si substrate 800, and a conduction layer 801 is formed. Then, as shown in FIG. 23, a diamond or SiC layer 802 is formed on the conduction layer 801. Then, as shown in FIG. 24, resist 803 is applied to the layer 802 except for the LED mounting portion, and Si is selectively grown. At this time, the Si does not have to be a single crystal, but can be polycrystalline. Thus, a Si base is formed at the LED mounting portion. This base is used later to form a waveguide, and is also used to align the LED since high accuracy is required in the alignment of the LED. On the other hand, in the case of the light receiving device, such a base is not required since such high accuracy is not required. As a result, the insulation layer beneath the light receiving device becomes thick, and thereby effective insulation can be obtained. After a base for the LED mounting portion is formed, the resist 803 is removed in the process shown in FIG. 24.

Figure 25:
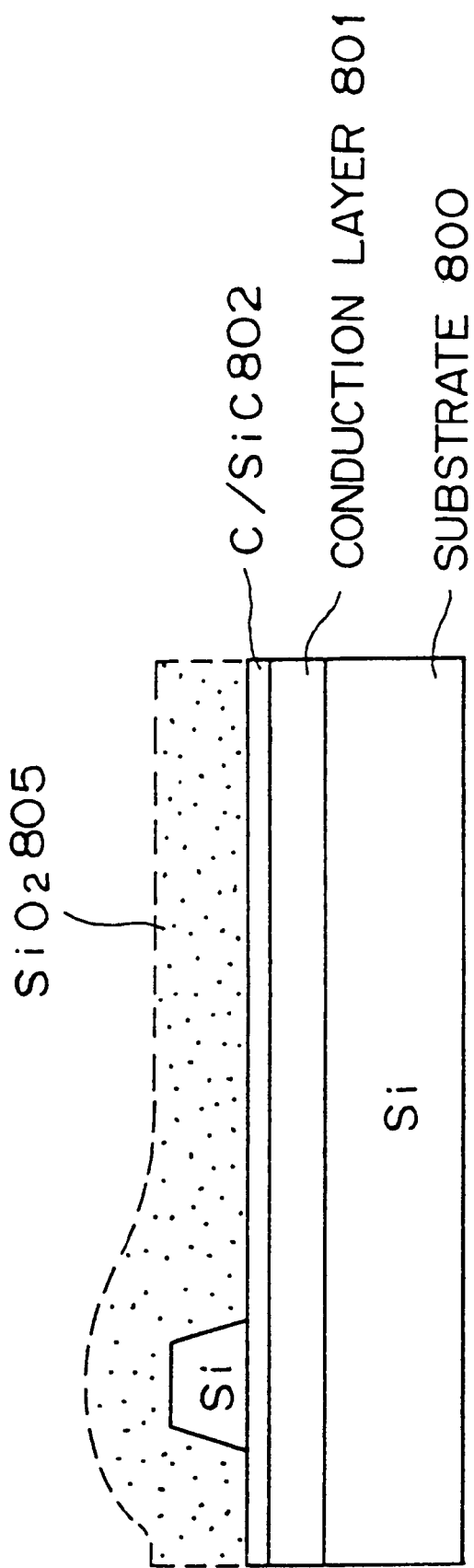
FIG. 25 explains an embodiment in the case where an SiC or diamond layer is formed at the bottom of an LED mounting portion or a light receiving device mounting portion and the manufacturing method (No. 4).
Figure 26:
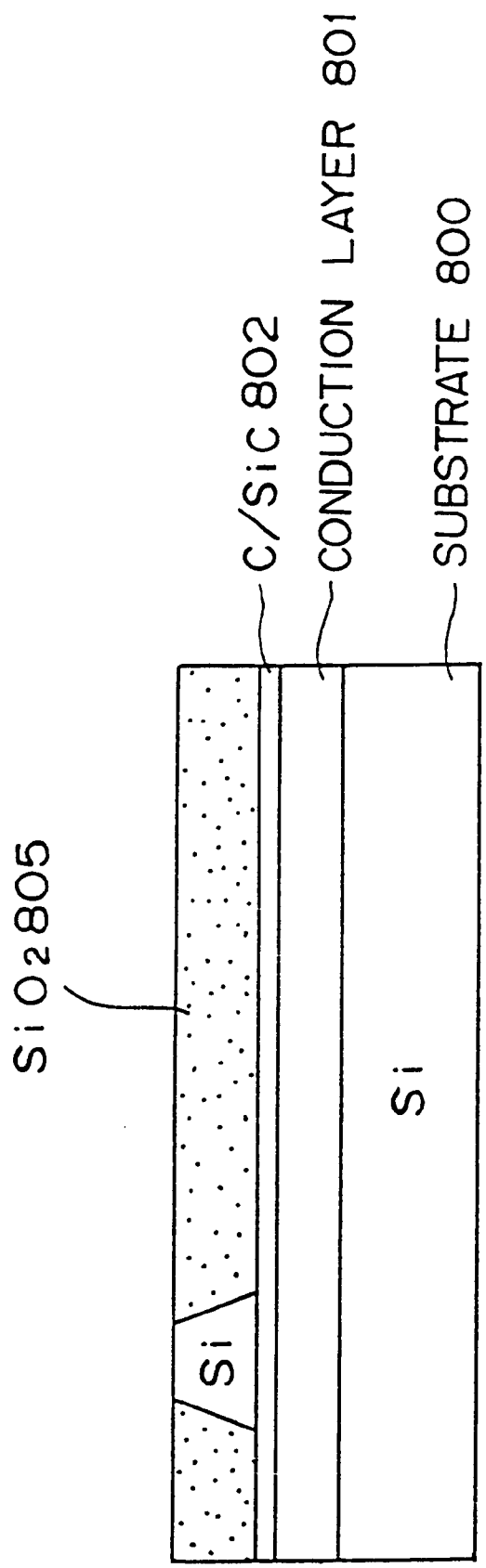
FIG. 26 explains an embodiment in the case where an SiC or diamond layer is formed at the bottom of an LED mounting portion or a light receiving device mounting portion and the manufacturing method (No. 5).

Then, as shown in FIG. 25, a $SiO_2$ layer 805 to be used for an insulation layer is formed using a flame deposition method, etc., and as shown in FIG. 26, the top of the $SiO_2$ layer 805 is polished and leveled until a base for the LED mounting portion appears.

Figure 27:
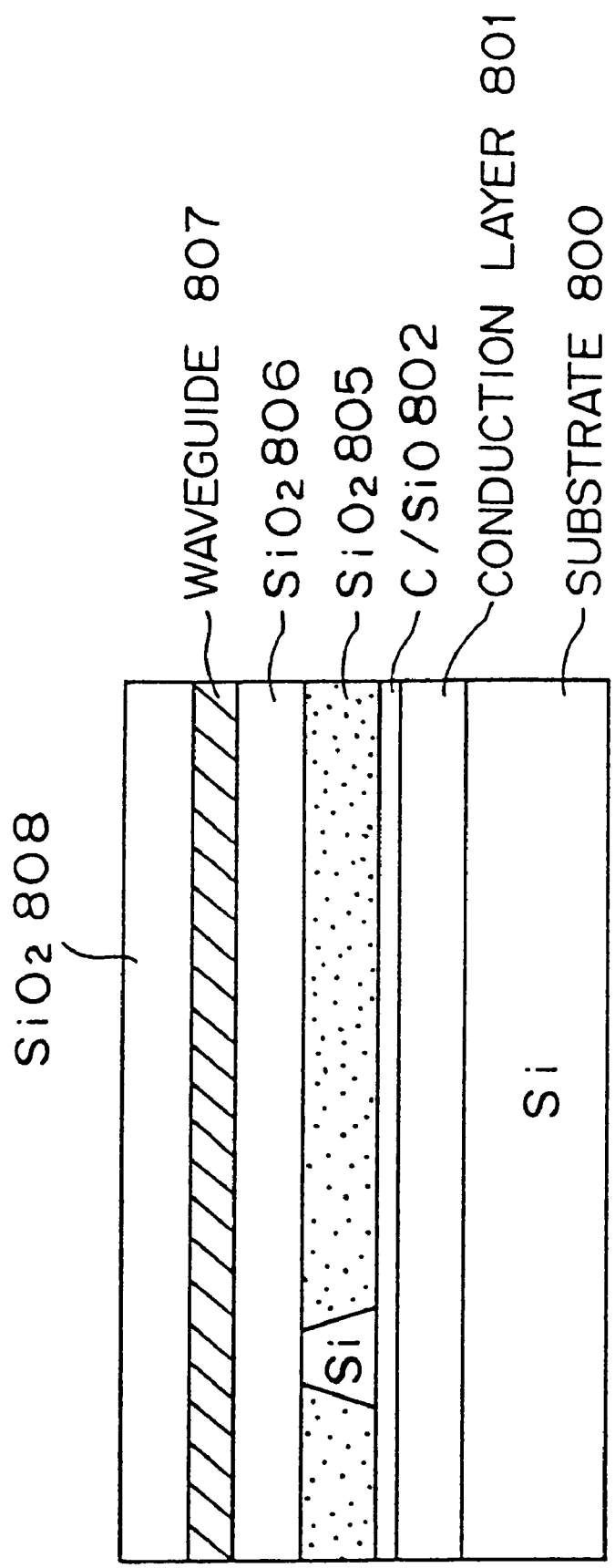
FIG. 27 explains an embodiment in the case where an SiC or diamond layer is formed at the bottom of an LED mounting portion or a light receiving device mounting portion and the manufacturing method (No. 6).

Then, as shown in FIG. 27, another $SiO_2$ layer 806 is laminated. This layer later becomes an underclad. A layer 807 to be used for a waveguide of which the refractive index is greater than the refractive index of the $SiO_2$ layer 806 is laminated on this. The waveguide is formed by laminating a substance to be used for a waveguide over all the surface of the $SiO_2$ layer 806, and then etching the layer after applying resist to a portion to be used for a waveguide. Another $SiO_2$ layer 808 is further laminated on the waveguide formed in this manner. This later becomes an overclad.

Figure 28:
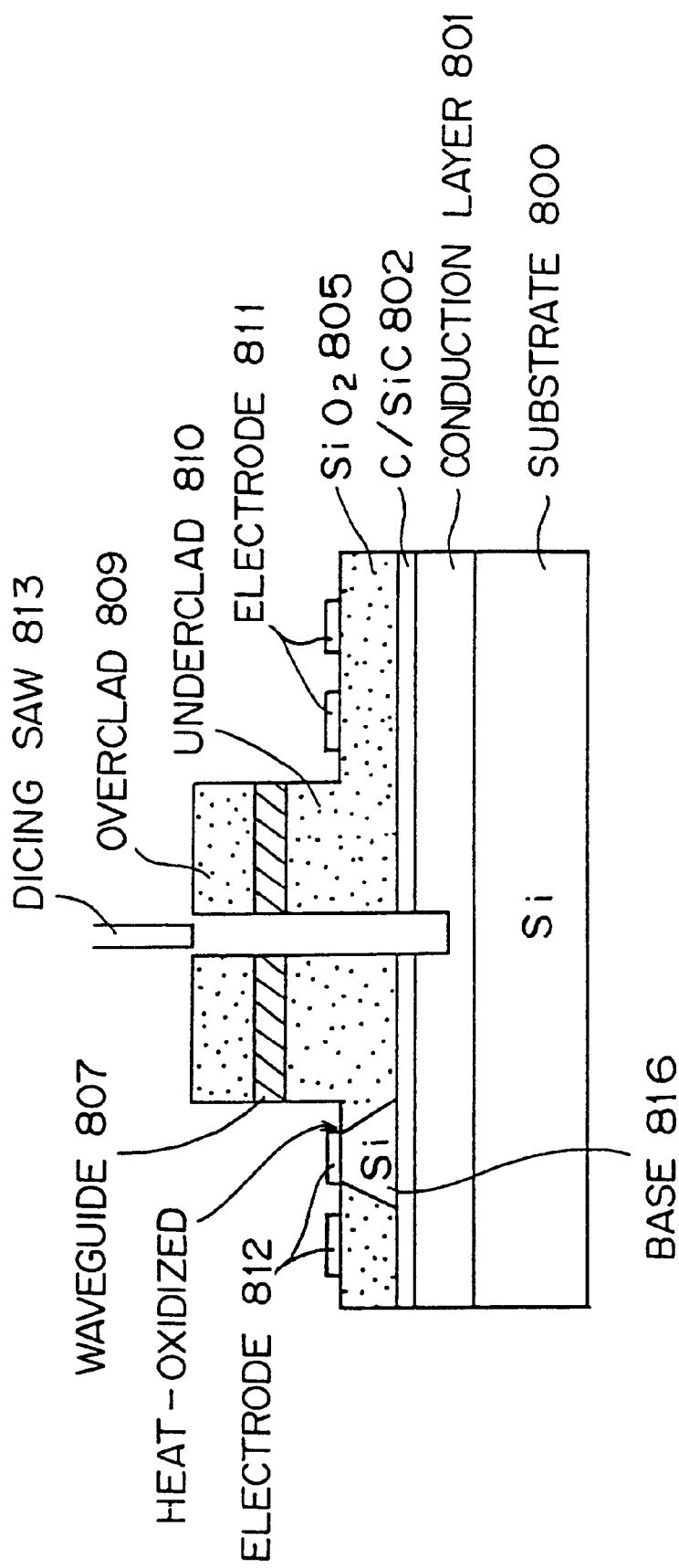
FIG. 28 explains an embodiment in the case where an SiC or diamond layer is formed at the bottom of an LED mounting portion or a light receiving device mounting portion and the manufacturing method (No. 7).

Then, as shown in FIG. 28, portions to be used for a waveguide are left as they are, and portions where the LED LD and the light receiving device PD are to be provided later are etched. The etching shall be so deep that the top of the base for the LED mounting portion may appear. Then, the top of the base for mounting the LED LD is oxidized by heating in an atmosphere of oxygen and steam, and electrodes 812 are formed on and adjacent to the top of the base. On the light receiving side, electrodes 811 are provided on the $SiO_2$ layer 805. As shown in FIGS. 3A and 3B, a groove is formed using a dicing saw 813 in a portion where a waveguide is branched in order to insert a multilayer film filter (WDM filter).

Figure 29:
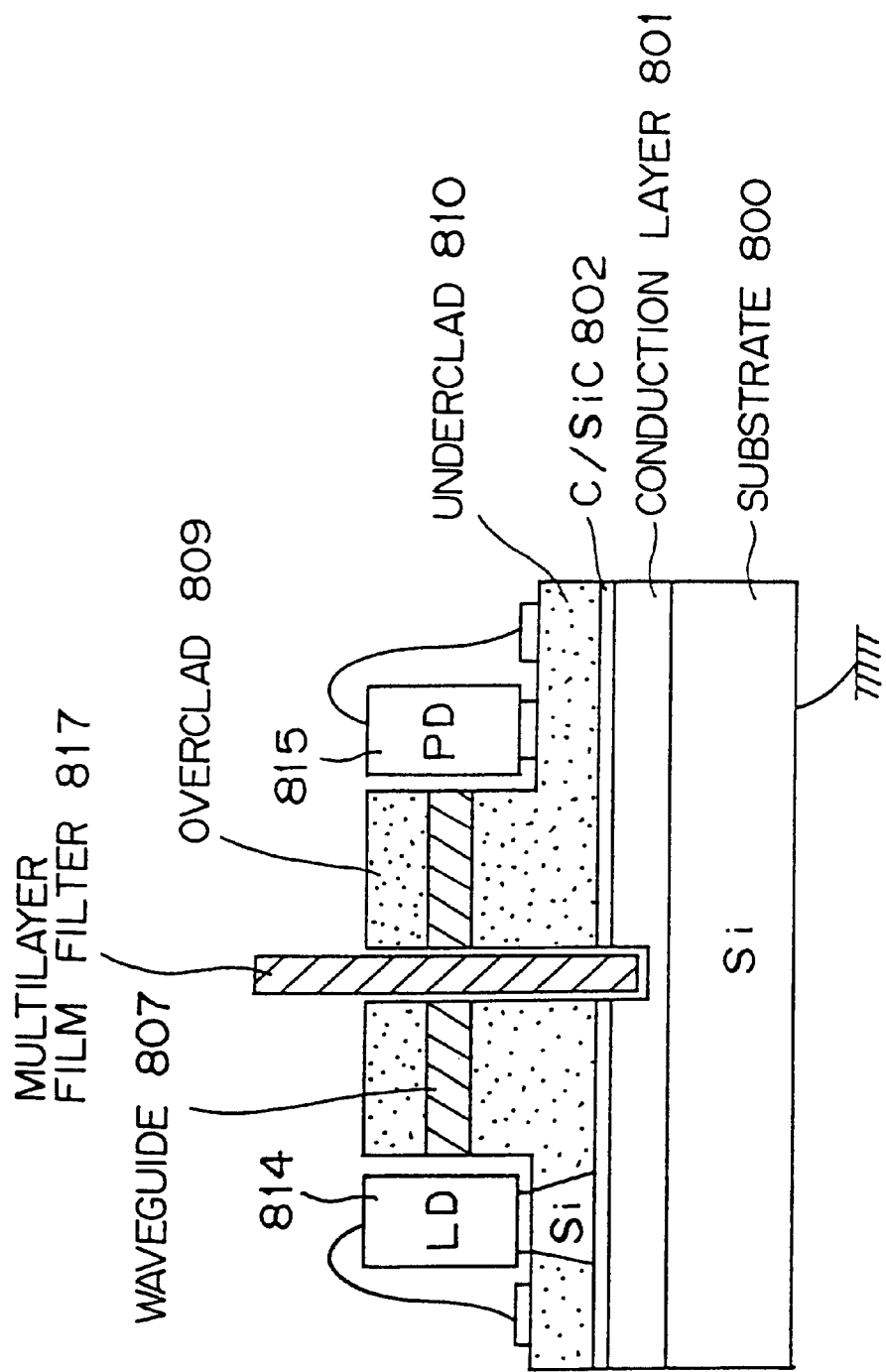
FIG. 29 explains an embodiment in the case where an SiC or diamond layer is formed at the bottom of an LED mounting portion or a light receiving device mounting portion and the manufacturing method (No. 8).

Finally, as shown in FIG. 29, a multilayer film filter 817 is inserted in the groove formed using the dicing saw 813 and fixed using a light transmitting adhesive, and the LED 814 and light receiving device 815 are mounted and aligned.

Although a metallic film is formed at the back of the substrate 800 as described above, the metallic film is omitted in these diagrams. Then, the potential of the substrate 800 is set to ground potential by grounding the metallic film.

In the above-mentioned embodiments, since a diamond layer or SiC layer with a low conductivity is provided, current can be more effectively prevented from flows from the LED 814 into the substrate 800. Furthermore, since the diamond layer or SiC layer has a high heat-conductivity, the heat of the LED 814 can be easily radiated, and the heat can be prevented from being concentrated. Since the bottom of the LED 814 is heat-oxidized, the insulation is further improved.

Furthermore, the bottom of the light receiving device 815 is an underclad 810, which is used as an insulation film. Particularly, since there is no base at the bottom of the light receiving device 815, and the insulation layer is thick, the inflow of current from the light transmitting element 814 can be effectively prevented.

Although in the previous embodiments the conduction layer 801 is directly grounded, in this embodiment the conduction layer 801 is not directly grounded. This is because the conduction layer 801 is substantially grounded by grounding the back of the substrate 800, since it is difficult to provide a diamond layer or SiC layer with a contact hole. Since the substrate 800 is made of Si, the diamond layer or SiC layer has a high electrical conductivity, and the current easily flows from the conduction layer 801 to the back side of the substrate 800, even if only the back side of the substrate 800 is grounded. Accordingly, almost the same effect as the case where the conduction layer 801 is directly grounded can be obtained.

As described above, according to the present invention, a means for reducing the crosstalk between the hybrid-mounted LED and light receiving device can be provided. Accordingly, a compact optical device capable of simultaneously transmitting and receiving can be provided, and greatly contributes to the spread of optical subscriber systems.

What is claimed is:

1. A manufacturing method of an optical transmitting and receiving device, comprising:

forming a conduction layer by doping an impurity on the surface of a substrate;

laminating an insulation layer on the conduction layer;

providing an optical waveguide on the insulation layer;

forming an electric wiring pattern, electrically disconnected from the conduction layer, on (the insulation layer and forming a conduction layer pad electrically connected to the conduction layer, which is separate from the electric wiring pattern; and mounting a light emitting device and a light receiving device, wherein the conduction layer is grounded so that the conduction layer pad is grounded.

2. The manufacturing method of an optical transmitting and receiving device according to claim 1, wherein a semiconductor substrate is used for said substrate, and forming said conduction layer by doping a p type or n type impurity on the surface of the semiconductor substrate.

3. The manufacturing method of an optical transmitting and receiving device according to claim 2, wherein an Si substrate is used for said semiconductor layer.

4. The manufacturing method of an optical transmitting and receiving device according to claim 2, wherein an impurity is doped over all the surface of said semiconductor substrate.

5. The manufacturing method of an optical transmitting and receiving device according to claim 2, wherein an impurity is doped at the bottom of a light emitting device mounting portion or light receiving device mounting portion of said semiconductor substrate.

6. The manufacturing method of an optical transmitting and receiving device according to claim 1, wherein said insulation layer includes an SiC layer or diamond thin film layer.

7. The manufacturing method of an optical transmitting and receiving device according to claim 1, wherein said insulation layer at the bottom of a light receiving device is thicker than said insulation layer of at the bottom of a light emitting device.

8. The manufacturing method of an optical transmitting and receiving device according to claim 1, further comprising:

providing a filter so as to intercept said optical waveguide, reflecting optical signals to be outputted from said light emitting device and through which pass optical signals to be received by said light receiving device, wherein the light receiving device and the light emitting device are located on each sides of the filter, and the exit of optical signals from said optical transmitting and receiving device is provided on the location side of the light emitting device.

9. A manufacturing method of an optical transmitting and receiving device hybrid-mounting at least a light emitting device and a light receiving device on the same substrate through an insulation layer, comprising:

forming a conduction layer electrically connectable to a constant potential portion on the surface layer portion of said substrate and at least below said light emitting device and said light receiving device mounting portions prior to the formation of said insulation layer; and forming an electric wiring pattern, electrically disconnected from the conduction layer, on the insulation layer and forming a conduction layer pad electrically connected to the conduction layer which is grounded and separate from the electric wiring pattern.

10. A manufacturing method of an optical transmitting and receiving device hybrid-mounting at least a light emitting device and a light receiving device on the same substrate through an insulation layer, comprising:

providing a semiconductor substrate of one conduction type for said substrate, and forming a conduction layer of another conduction type the reverse of said one conduction type which forms a pn junction together with said semiconductor substrate on the surface layer portion of said substrate and at least below said light emitting device and said light receiving device mounting portions prior to the formation of said insulation layer; and forming an electric wiring pattern, electrically disconnected from the conduction layer, on the insulation layer and forming a conduction layer pad electrically connected to the conduction layer which is grounded and separate from the electric wiring pattern.

11. A manufacturing method of a platform of an optical transmitting and receiving device, comprising:

forming a conduction layer by doping an impurity on the surface of a substrate;

laminating an insulation layer on the conduction layer;

providing an optical waveguide on the insulation layer;

forming an electric wiring pattern on the insulation layer, electrically disconnected from the conduction layer, on the insulation layer; and forming a conduction layer pad electrically connected to the conduction layer which is grounded and separate from the electric wiring pattern.

* * * * *